US012010816B2

(12) United States Patent
Narain et al.

(10) Patent No.: US 12,010,816 B2
(45) Date of Patent: Jun. 11, 2024

(54) NUCLEATION CONTROL SYSTEM AND METHOD LEADING TO ENHANCED BOILING BASED ELECTRONIC COOLING

(71) Applicant: MICHIGAN TECHNOLOGICAL UNIVERSITY, Houghton, MI (US)

(72) Inventors: Amitabh Narain, Houghton, MI (US); Soroush Sepahyar, Hancock, MI (US); Divya Kamlesh Pandya, Houghton, MI (US); Vibhu Vivek, Santa Clara, CA (US)

(73) Assignee: MICHIGAN TECHNOLOGICAL UNIVERSITY, Houghton, MI (US)

(*) Notice: Subject to any disclaimer, the term of this patent is extended or adjusted under 35 U.S.C. 154(b) by 208 days.

(21) Appl. No.: 17/291,728

(22) PCT Filed: Nov. 12, 2019

(86) PCT No.: PCT/US2019/060994
§ 371 (c)(1),
(2) Date: May 6, 2021

(87) PCT Pub. No.: WO2020/102239
PCT Pub. Date: May 22, 2020

(65) Prior Publication Data
US 2022/0015266 A1 Jan. 13, 2022

Related U.S. Application Data

(60) Provisional application No. 62/870,624, filed on Jul. 3, 2019, provisional application No. 62/833,551, filed (Continued)

(51) Int. Cl.
*H05K 7/20* (2006.01)
*F28D 15/02* (2006.01)
(Continued)

(52) U.S. Cl.
CPC ..... *H05K 7/20327* (2013.01); *F28D 15/0233* (2013.01); *F28D 15/046* (2013.01);
(Continued)

(58) Field of Classification Search
CPC ........ F28F 13/185; F28F 13/187; F28F 13/10; F28F 2260/02; H01L 23/427; H05K 7/20309; F28D 15/046; F28D 15/0233
See application file for complete search history.

(56) References Cited

U.S. PATENT DOCUMENTS 7,238,085 B2   7/2007   Montierth et al.
7,261,144 B2   8/2007   Thome et al.
(Continued)

FOREIGN PATENT DOCUMENTS

WO   WO-2014047338 A1 *  3/2014   ............. F28F 13/10
WO   WO2014047338 A1    3/2014

OTHER PUBLICATIONS

Agarwal et al., "Principle and applications of microbubble and nanobubble technology for water treatment" Chemosphere 84, No. 9 (2011): pp. 1175-1180.
(Continued)

*Primary Examiner* — Tavia Sullens
*Assistant Examiner* — Khaled Ahmed Ali Al Samiri
(74) *Attorney, Agent, or Firm* — Michael Best & Friedrich LLP

(57) ABSTRACT

A cooling module for an electronic device includes a body having formed therein a plurality of channels, a micro-structured boiling surface, a piezoelectric transducer, an inlet header, and an outlet header. Each channel of the plurality of channels is defined by a first channel surface and opposing lateral channel surfaces cooperatively defining a rectangular cross section normal to a channel axis. The micro-structured boiling surface is positioned adjacent the
(Continued)

first channel surface of each channel. The piezoelectric transducer is in acoustic communication with one of the opposing lateral channel surfaces of each channel and configured to direct acoustic waves on the micro-structured boiling surface. The inlet header is in fluid communication with each channel of the plurality of channels. The outlet header is in fluid communication with each channel of the plurality of channels.

11 Claims, 20 Drawing Sheets

Related U.S. Application Data on Apr. 12, 2019, provisional application No. 62/759,961, filed on Nov. 12, 2018.

(51) Int. Cl.
  *F28D 15/04* (2006.01)
  *F28F 13/10* (2006.01)
(52) U.S. Cl.
  CPC .......... *F28F 13/10* (2013.01); *H05K 7/20309* (2013.01); *F28F 2260/02* (2013.01)

(56) References Cited

U.S. PATENT DOCUMENTS

| | | | |
|---|---|---|---|
| 7,730,605 B2* | 6/2010 | Yeh | F28D 15/0233 29/613 |
| 8,051,905 B2* | 11/2011 | Arik | H01L 23/4735 239/102.1 |
| 9,103,468 B2 | 8/2015 | Li et al. | |
| 9,207,025 B2 | 12/2015 | Varanasi et al. | |
| 9,327,317 B2* | 5/2016 | Hynynen | H10N 30/875 |
| 9,603,284 B2 | 3/2017 | Lyon | |
| 2006/0137856 A1 | 6/2006 | Popovich | |
| 2007/0023169 A1 | 2/2007 | Mahalingam et al. | |
| 2013/0025831 A1 | 1/2013 | Attinger et al. | |
| 2016/0054031 A1 | 2/2016 | Echart et al. | |
| 2017/0176114 A1 | 6/2017 | Kandlikar et al. | |
| 2017/0299239 A1 | 10/2017 | Steven | |

OTHER PUBLICATIONS

Aquila Group, Aquarius Water Cooled Computing Solutions, Fixed-plate Liquid-cooling solution: webpage: https://www.aquilagroup.com/cooling/, Copyright 2022, (8 Pages).
Asetek, "Passion. Precision. Performance.", website: https://www.asetek.com, Copyright 2021 (5 Pages).
Avgerinou et al., "Trends in data centre energy consumption under the European code of conduct for data centre energy efficiency" Energies 10, (2017): 1470, (18 Pages).
Bar-Cohen et al., "Design and optimization of air-cooled heat sinks for sustainable development", IEEE transactions on components and packaging technologies 25, No. 4, (2002): pp. 584-591.
Bigham et al., "Microscale study of mechanisms of heat transfer during flow boiling in a microchannel" International Journal of Heat and Mass Transfer 88 (2015): pp. 111-121.
Campbell, Steve. "Is Liquid Cooling Ready to Go Mainstream?" URL: https://www.hpcwire.com/2017/02/13/liquid-cooling-ready-go-mainstream, Feb. 13, 2017 (6 Pages).
Carey VP, "Liquid-vapor phase-change phenomena. Series in chemical and mechanical engineering", Hemisphere Publishing Corporation, New York (1992), (5 Pages—Table of Contents of Book).
Chainer et al., "Improving Data Center Energy Efficiency with Advanced Thermal Management", IEEE Transactions on Components, Packaging and Manufacturing Technology (2017), pp. 1228-1239.
Chien et al., "A nucleate boiling model for structured enhanced surfaces", International Journal of Heat and Mass Transfer 41, No. 14 (1998), pp. 2183-2195.
Chu et al., "Structured surfaces for enhanced pool boiling heat transfer", Applied Physics Letters 100, No. 24 (2012): 241603, (5 Pages).
Chu et al., "Hierarchically structured surfaces for boiling critical heat flux enhancement", Applied Physics Letters 102, No. 15 (2013): 151602, (5 Pages).
Coolit Systems, "771-00012 rev A18 Rack DCLC Product Guide," URL, https://ww1.prweb.com/prfiles/2018/11/11/15910148/771-00012%20rev%20A18_NEW%20CoolIT%20Rack%20DCLC%20Product%20Guide.pdf, first accessed at least as early as Jul. 5, 2019, (16 Pages).
Del Valle et al., "Subcooled flow boiling at high heat flux", International Journal of Heat and Mass Transfer 28, No. 10 (1985): pp. 1907-1920.
Dong et al. "An experimental investigation of enhanced pool boiling heat transfer from surfaces with micro/nano-structures" International Journal of Heat and Mass Transfer 71 (2014): pp. 189-196.
Douglas et al., "Acoustically Enhanced Boiling Heat Transfer," THERMINIC, Budapest, Hungary, Sep. 17-19, 2007, (5 Pages).
Douglas et al., "Acoustically enhanced boiling heat transfer", Physics of Fluids 24, No. 5 (2012): 052105, (18 Pages).
Fuijitsu, "The Vision of the future with Human-centered technology" website: http://www.fujitsu.com/global/, Copyright 1995 (7 Pages).
Gerardi et al., "Infrared thermometry study of nanofluid pool boiling phenomena", Nanoscale research letters 6, No. 1 (2011): 232, (17 Pages).
Ghiaasiaan, S.M., "Two-phase flow, boiling, and condensation: in conventional and miniature systems", Cambridge University Press, Cambridge, (2007), (8 Pages—Table of Contents of Book).
Google's Green Data Centers: Network POP Case Study. URL: https://static.googleusercontent.com/media/www.google.com/en//corporate/datacenter/dc-best-practices-google.pdf, 2011, (10 Pages).
Gorgitrattanagul, P., "Experimental investigations of temperature controlled innovative annular flow-boiling of FC-72 in millimeter scale ducts—steady and enhanced pulsatile realizations", Ph. D. Thesis, Michigan Technological University, Dec. 2017, (113 Pages).
Gotovskiy, M. A. et al., "Use of Combines Steam-Water and Organic Rankine Cycles for Achieving Better Efficiency of Gas Turbine Units and Internal Combustion Engines", Thermal Engineering 59, No. 3 (2012): pp. 236-241.
Grebene, H. R. et al., "Phase Locking as a New Approach For Tuned Integrated Circuits", ISSCC Digest of Technical Papers, pp. 100-101, Feb. 1969.
Gupta et al., MS University, "Applied Mechanics; New Applied Mechanics Findings from MS University Discussed, "Vapor Bubble Formation, Forces, and Induced Vibration: A Review, Applied Mechanics Reviews, May 2016, vol. 68, (12 Pages).
Heffington, S et al., "Enhanced boiling heat transfer by submerged ultrasonic vibrations", Therminic Sophia Antipolis, Cote d'Azur (2004), (5 Pages).
Johnsson, Lennart, "Overview of Data Centers Energy Efficiency Evolution. Handbook of Energy Aware and Green Computing, vol. 2, Chap. 43, Ishfaq Ahmad, Sanjay Ranka." (2012). Also: Johnsson, Lennart. "Overview of Data Centers Energy Efficiency Evolution", (2012): pp. 983-1028. Also @ URL: https://pdfs.semanticscholar.org/559f/5b4bb297999ed00d4a787cf9317ec515afa1.pdf.
Kandlikar, Satish G., "Heat transfer mechanisms during flow boiling in microchannels", In ASME 2003 1st International Conference on Microchannels and Minichannels, pp. 33-46. American Society of Mechanical Engineers, 2003.
Karpelson, Michael, et al., "Driving high voltage piezoelectric actuators in microrobotic applications", Sensors and actuators A: Physical 176 (2012): pp. 78-89.
Kim, Jungho, "Spray cooling heat transfer: the state of the art", International Journal of Heat and Fluid Flow 28, No. 4 (2007): pp. 753-767.
Kim et al., "Surface wettability change during pool boiling of nanofluids and its effect on critical heat flux", International Journal of Heat and Mass Transfer 50, No. 19-20 (2007): pp. 4105-4116.

(56) References Cited

OTHER PUBLICATIONS

Kivisalu et al., "Results for High Heat-Flux Flow Realizations in Innovative Operations of Milli-Meter Scale Condensers and Boilers", International Journal of Heat and Mass Transfer. 2014, 75, (2014), pp. 381-398.

Koomey, Jonathan, "Growth in data center electricity use 2005 to 2010", A report by Analytical Press, completed at the request of The New York Times 9 (2011), (24 Pages).

Kunkelmann et al., "The effect of three-phase contact line speed on local evaporative heat transfer: Experimental and numerical investigations", International Journal of Heat and Mass Transfer, (2012), 55 (7-8): pp. 1896-1904.

Kuo et al., "Bubble dynamics during boiling in enhanced surface microchannels" Journal of Microelectromechanical Systems 15, No. 6 (2006): pp. 1514-1527.

Legay et al., "Enhancement of heat transfer by ultrasound: review and recent advances", International Journal of Chemical Engineering, (2011), (18 Pages).

Li et al., "Nanostructured copper interfaces for enhanced boiling" small 4, No. 8 (2008): pp. 1084-1088.

Marcinichen et al., "Dynamic flow control and performance comparison of different concepts of two-phase on-chip cooling cycles", Applied Energy 114 (2014): pp. 179-191.

McCarthy et al., "Materials, fabrication, and manufacturing of micro/nanostructured surfaces for phase-change heat transfer enhancement", Nanoscale and Microscale Thermophysical Engineering 18, No. 3 (2014): pp. 288-310.

Mchale et al., "Bubble nucleation characteristics in pool boiling of a wetting liquid on smooth and rough surfaces.", International Journal of Multiphase Flow, 36 (4), (2010): pp. 249-260.

Moghaddam et al., "Physical mechanisms of heat transfer during single bubble nucleate boiling of FC-72 under saturation conditions-I Experimental investigation", International Journal of Heat and Mass Transfer 52, No. 5-6 (2009): pp. 1284-1294.

Mouton, The Unveiling of a Revolutionary New Liquid Cooling Technology, Jun. 2, 2016, (5 Pages).

Narain et al., "Significant Enhancements in Data Center Cooling Rates (or Power Density) Along with Associated Waste Heat Recovery as Electricity," ASME ES 2019—3967, 13th International Conference on Energy Sustainability Bellevue, WA, Jul. 14-17, 2019, (27 Pages).

Narain et al., "Internal Annular Flow Condensation and Flow Boiling: Context, Results, and Recommendations", In: Kulacki FA (ed.) Handbook of Thermal Science and Engineering, 2018, vol. 3, pp. 2075-2162, Springer, Cham. Invited Article.

Ohta et al., "Experimental investigation on observed scattering in heat transfer characteristics for flow boiling in a small diameter tube." Heat transfer engineering 30, No. 1-2 (2009): pp. 19-27.

Parida et al., "Experimental investigation of water cooled server microprocessors and memory devices in an energy efficient chillerless data center", In Semiconductor Thermal Measurement and Management Symposium (SEMI-THERM), 2012 28th Annual IEEE, pp. 224-231.

Radek et al., "Efficient surfaces for boiling heat transfer enhancement", Czasopismo Techniczne 2016, No. Mechanika Zeszyt 4-M, (2016): pp. 3-8.

Schmidt et al., "Experimental Study of the Effects of an Ultrasonic Field in a Nucleate Boiling System," J. Heat Transfer, (1967), 89(4):, pp. 289-294.

Sepahyar, "Influence of Micro-nucleate Boiling on Annular Flow Regime Heat Transfer Coefficient Values and Flow Parameters—For High Heat-Flux Flow Boiling of Water", Ph. D. Thesis, Michigan Technological University, Dec. 2017, (149 Pages).

Shariff, "Enhancement of flow boiling in meso scale channels with subsonic vibrations", J. Micro-Nano Mech. (2009) 5:93-102, (10 Pages).

Shariff, "Acoustics vibrations to enhance flow boiling in micro channels", Int. J. of Thermal & Environmental Engineering 2, No. 1 (2011):, pp. 19-25.

Shinde, MSME from MTU. "Innovative Fin-tubes for a Standard Staggered-bundle Family Leading to Significant Reductions in Air-side Thermal and Pressure-drop Resistances for a Popular Heat-exchanger—Quantitative Characterizations based on a Unique Synthesis of Experiments, Modeling, and Reliable Computations", Fall 2018, (74 Pages).

Tartière et al., "A World Overview of the Organic Rankine Cycle Market", 2017. 129: pp. 2-9.

Tuma, Phillip E, "The merits of open bath immersion cooling of datacom equipment", In Semiconductor Thermal Measurement and Management Symposium, SEMI-THERM 2010. 26th Annual IEEE, pp. 123-131.

Vojini, Amit Dev, MSME from MTU. "Innovative Fin-tubes for a Standard Staggered-bundle Family Leading to Significant Reductions in Air-side Thermal and Pressure-drop Resistances for a Popular Heat-exchanger—Modeling and Analysis in the Context of its Deployment Advantages in the Energy-sector", (Fall 2018), (138 Pages).

Welch et al., "Flexible Combined Cycle Gas Turbine Power Plant Utilising Organic Rankine Cycle Technology" in ASME Turbo Expo 2016: Turbomachinery Technical Conference and Exposition, American Society of Mechanical Engineers, (11 Pages).

Wen et al., "Experimental investigation into the pool boiling heat transfer of aqueous based γ-alumina nanofluids", Journal of Nanoparticle Research 7, No. 2-3 (2005): pp. 265-274.

Wilson, J.R., "Electronics Cooling Depends on Innovative Approaches to Thermal Management", Military & Aerospace Electronics, 2009 (26 Pages).

Wirtz et al., "Effect of Flow Bypass on the Performance of Longitudinal Fin Heat Sinks", ASME Journal of Electronic Packaging, 1994, vol. 116, pp. 206-211.

Wu et al. "Experimental evaluation of a controlled hybrid two-phase multi-microchannel cooling and heat recovery system driven by liquid pump and vapor compressor." International Journal of Refrigeration 36, No. 2 (2013): pp. 375-389.

Yadav et al., "Mitigation of Flow Maldistribution in Parallel Microchannel Heat Sink," IEEE Transactions on Components, Packaging and Manufacturing Technology, 2018, In Press—Print ISSN: 2156-3950, Published Online ISSN: 2156-3985.

* cited by examiner

NUCLEATION CONTROL SYSTEM AND METHOD LEADING TO ENHANCED BOILING BASED ELECTRONIC COOLING

CROSS-REFERENCE TO RELATED APPLICATIONS

This application is a U.S. national stage entry of International Patent Application No. PCT/US2019/060994, filed on Nov. 12, 2019, which claims priority to U.S. Provisional Patent Application No. 62/759,961, filed on Nov. 12, 2018, to U.S. Provisional Patent Application No. 62/833,551, filed on Apr. 12, 2019, and to U.S. Provisional Patent Application No. 62/870,624, filed on Jul. 3, 2019, the contents of all of which are hereby incorporated by reference in their entirety.

BACKGROUND

Flow boiling can be implemented within mini- or microchannels to transfer heat from a heated surface to a heat transfer fluid. As used herein, the term "microchannel" is intended to refer to a flow channel having a diameter up to about 5-6 millimeters. At the micro scale, and at certain critical heat-flux (CHF) levels, flow instabilities and other duct- and system-level instabilities can induce a dynamic local dry-out phenomenon between the heated surface and attached vapor bubbles. This is more likely at high exit vapor mass qualities.

SUMMARY OF THE INVENTION

The disclosure provides, in one aspect, a cooling module for an electronic device. The cooling module includes a body having formed therein a plurality of channels, a micro-structured boiling surface, a piezoelectric transducer, an inlet header, and an outlet header. Each channel of the plurality of channels is defined by a first channel surface and opposing lateral channel surfaces cooperatively defining a rectangular cross section normal to a channel axis. The micro-structured boiling surface is positioned adjacent the first channel surface of each channel. The piezoelectric transducer is in acoustic communication with one of the opposing lateral channel surfaces of each channel and configured to direct acoustic waves on the micro-structured boiling surface. The inlet header is in fluid communication with each channel of the plurality of channels. The outlet header is in fluid communication with each channel of the plurality of channels.

The disclosure provides, in another aspect, a method of cooling an electronic device. The method includes passing a heat transfer fluid through one or more channels formed in a cooling module body, each channel defined by a first channel surface and lateral channel surfaces and further including a micro-structured boiling surface adjacent the first channel surface. The method also includes energizing a piezoelectric transducer in acoustic communication with one of the opposing lateral channel surfaces of each channel to direct in-plane acoustic waves on the micro-structured boiling surface and its vicinity to facilitate formation of microbubbles within the heat transfer fluid at microbubble nucleation sites on the micro-structured boiling surface.

The disclosure provides, in another aspect, a controller for a server rack cooling loop for cooling a plurality of electronic devices. The controller includes memory and a processor. The processor is configured to receive inputs of a cooling loop temperature and pressure, determine desired flow boiling parameters of the cooling loop, and transmit signals to a piezoelectric transducer in acoustic communication with a flow channel that is in thermal communication with an electronic device. The signals are configured to operate the piezoelectric transducer to resonate a micro-structured boiling surface positioned within the flow channel.

Figure 1A:
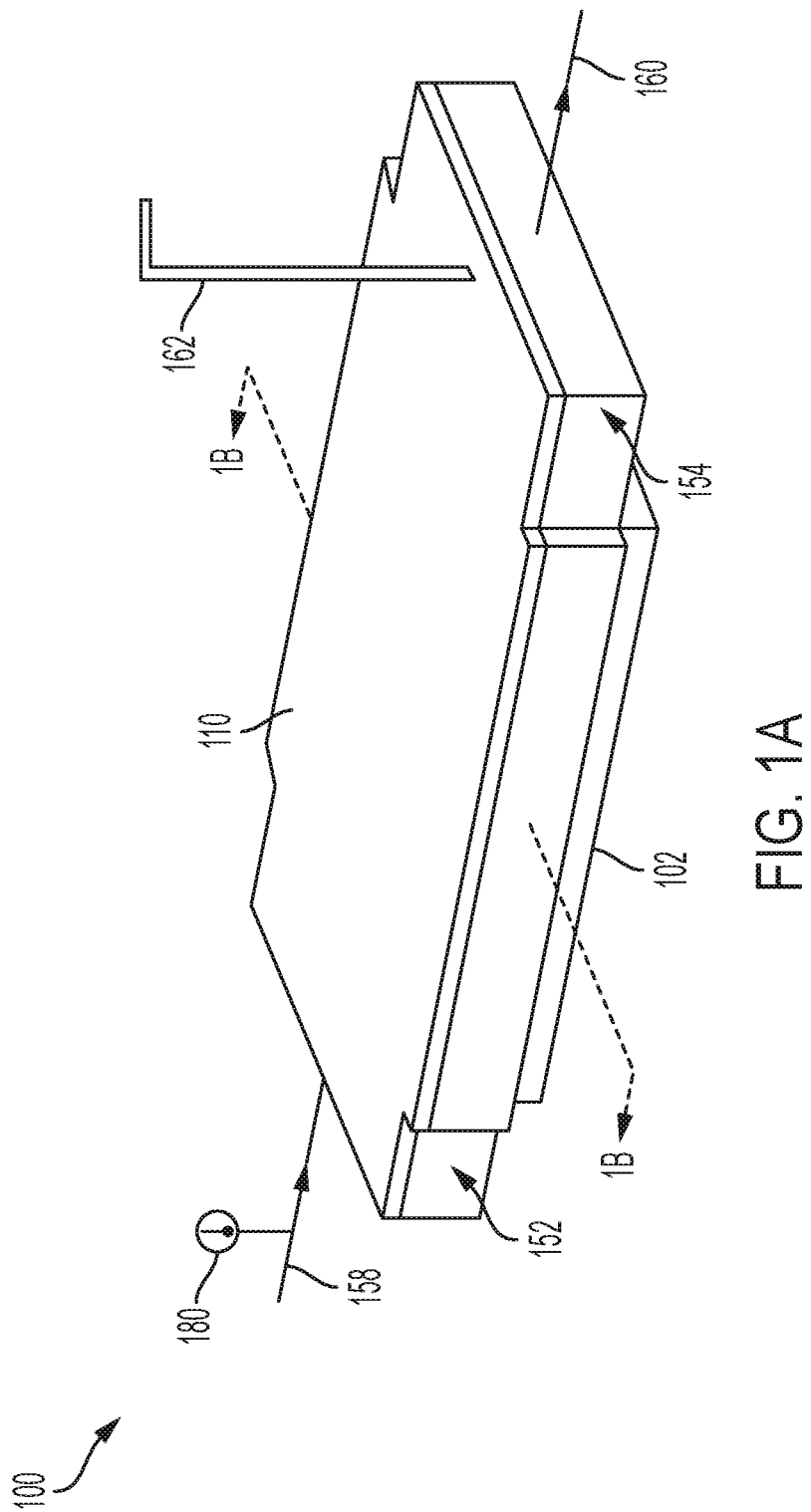
FIG. 1A is a perspective view of a cooling unit (e.g., a heat sink) for performing enhanced flow boiling according to one embodiment.

Before any embodiments of the disclosure are explained in detail, it is to be understood that the disclosure is not limited in its application to the details of the formation and arrangement of components set forth in the following description or illustrated in the accompanying drawings. The disclosure is capable of supporting other embodiments and of being practiced or of being carried out in various ways. Also, it is to be understood that the phraseology and terminology used herein is for the purpose of description and should not be regarded as limiting.

DETAILED DESCRIPTION

FIGS. 1-8 illustrate a "mini" microchannel architecture two-phase cooling unit 100 (e.g., a heatsink 100) that enhances flow boiling in microchannels. As used throughout, the term "microchannel" is intended to refer to a flow channel having a diameter up to about 5-6 millimeters. With reference to FIGS. 1A and 1B, the cooling unit 100 couples to a heat source 102 (e.g., an electronic device such as a microchip, an integrated circuit, etc.) to facilitate removal of heat energy from the heat source 102. While the illustrated cooling unit 100 is described in connection with cooling electronic devices, other cooling applications are also possible and contemplated herein. As discussed below, the cooling unit 100 significantly enhances flow boiling heat transfer rates as compared to existing flow boiling heat exchangers, as well as commercially available single-phase liquid cooling approaches.

The cooling unit 100 defines a plurality of microchannels 104. A heat exchanging or cooling fluid 106 (FIG. 2) is directed to flow through the microchannels 104 to accept and carry away heat energy from the heat source 102. Although many formulations of cooling fluids are possible, one exemplary, electronics and environment friendly formulation contemplated (and utilized) herein is 3M™ Novec™ Engineered Fluid HFE-7100.

Figure 8:
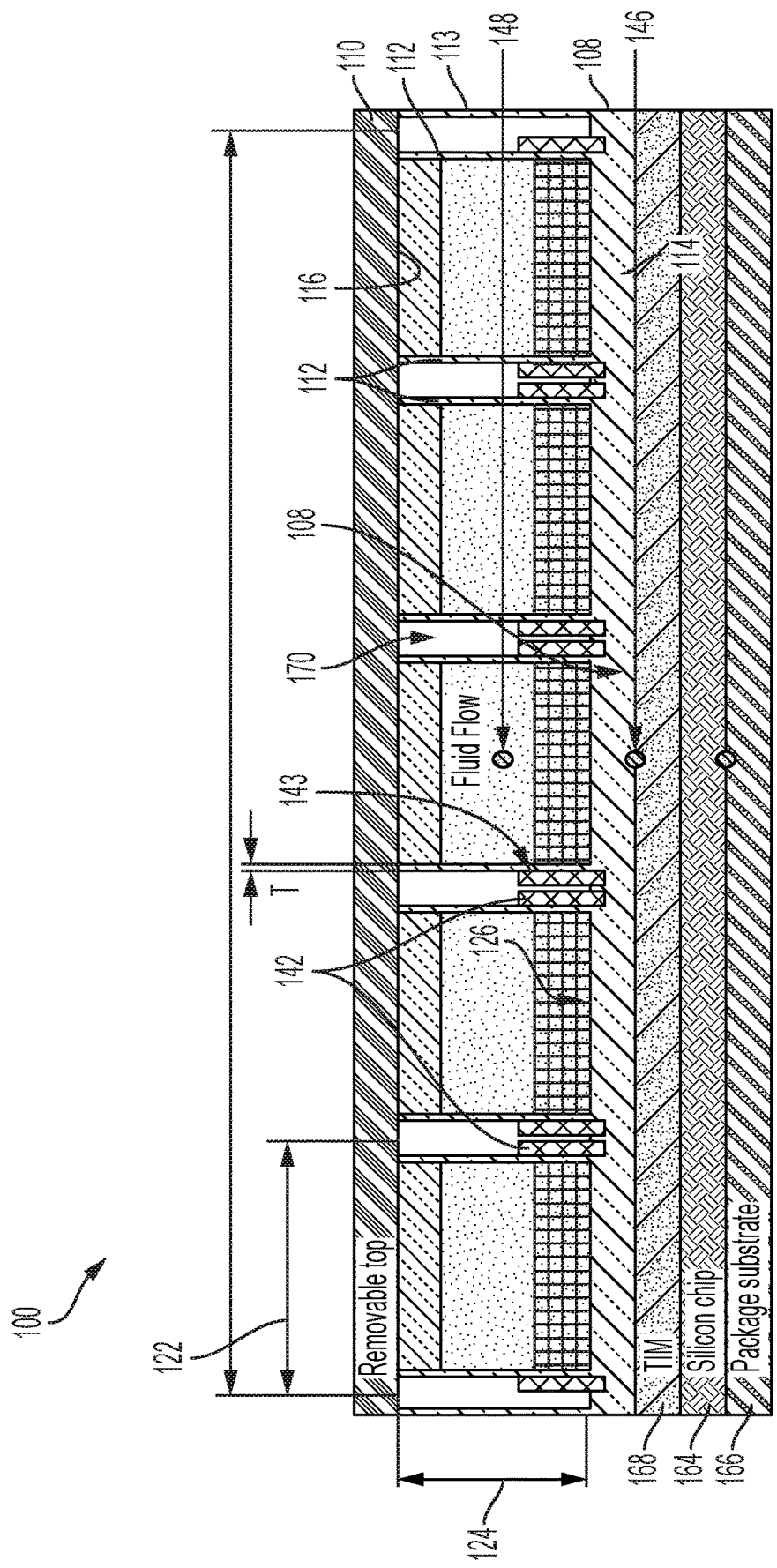
FIG. 8 is a schematic cross-sectional view of the cooling unit of FIG. 1, taken along line 1B-1B of FIG. 1A.

As shown in FIGS. 1 and 8, the cooling unit 100 includes a base plate 108 that couples to the heat source 102 (e.g., a microchip 164 mounted on a server), and a removable top plate 110 opposite the base plate 108. The microchannels 104 extend between the bottom and top plates 108, 110 and generally parallel thereto. Each microchannel 104 is defined between opposing sidewalls 112, a bottom wall 114 defined by a portion of the base plate 108, and a top wall 116 defined by a portion of the top plate 110. In the illustrated embodiment, the sidewalls 112 and the base plate 108 are formed from a thermally-conductive material such as, but not limited to, copper. The top plate 110 may likewise be formed from a thermally-conductive material. In some embodiments, the top wall 116 may be formed from a transparent material (e.g., polycarbonate) that renders the space within the microchannel 104 visible from outside the microchannel 104. The cooling unit 100 also includes end walls 113 that extend between the bottom and top plates 108, 110 and laterally contain the microchannels 104. In some embodiments, thermal sheets (e.g., poly-graphite sheets; not shown) may extend between the base plate 108 and the end walls 113. The thermal sheets can reduce flow and thermal maldistribution across the microchannels 104.

Figure 2:
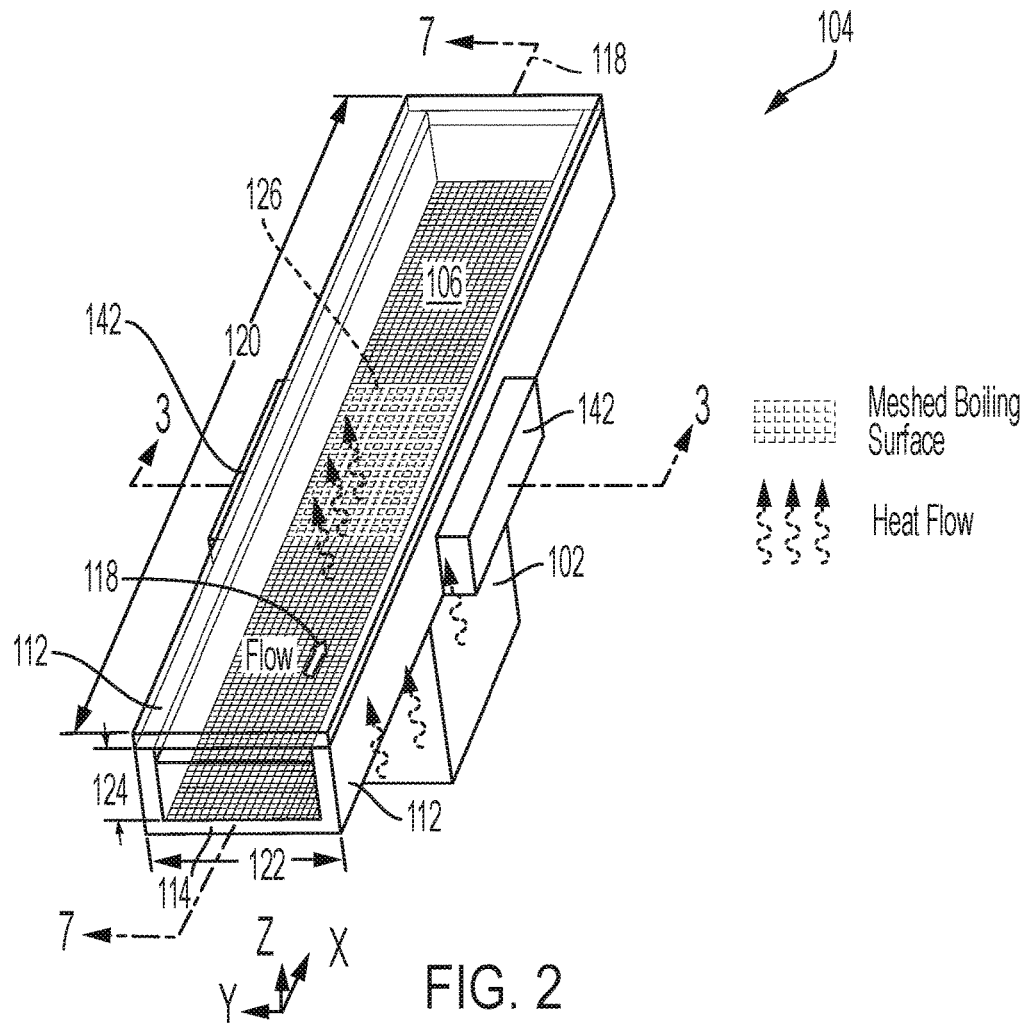
FIG. 2 is a perspective view of a microchannel of the cooling unit of FIG. 1A.

With reference to FIG. 2, the illustrated microchannel 104 has a generally elongated shape extending along a central axis 118 with a generally rectangular cross-section perpendicular thereto, and includes a length 120, a width 122, and a height 124. The length 120 is measured between end portions of the sidewalls 112 in a direction parallel to the central axis 118. The width 122 is measured between the sidewalls 112 in a direction perpendicular to the sidewalls 112 and generally transverse to the central axis 118. The height 124 is measured between the bottom and top walls 114, 116. For the illustrated microchannel 104 of FIG. 2, the length 120 is approximately 50 millimeters (mm), the width 122 is approximately 10 mm, and the height 124 is approximately 5 mm. Accordingly, the illustrated microchannel 104 includes a "mini-channel" construction (i.e., as compared to many existing micron-scale channels having channel width/height dimensions on the order of 600 micrometers (μm) or less). Such a "mini-channel" construction is sought because of a need to meet average heat-flux impositions from the heat source 102 in the range of 50-100 $W/cm^2$ or higher, as large values of total mass-flux (G) and very large vapor volume fluxes are required for such high heat-flux values, which lead to large pumping powers and unacceptable performances (flow instabilities, etc.).

With reference to FIG. 8, the bottom wall 114 defines and/or at least partially supports a micro-structured boiling surface 126 that faces an interior of the microchannel 104. During operation of the cooling unit 100, the cooling fluid 106 undergoes a flow boiling process within each microchannel 104. A major component the flow boiling process involves nucleation, growth, and detachment of micronscale (μm) vapor microbubbles transpiring at the microstructured boiling surface 126. Stimulating the formation and subsequent detachment of these vapor microbubbles leads to a significant enhancement in the heat transfer coefficient (HTC) of the flow boiling process.

To enhance the rates of vapor bubble nucleation, growth, and detachment, the micro-structured boiling surface 126 is defined by a plurality of interconnected micro-structures 128 (FIG. 3) that extend upward from the bottom wall 114 into the microchannel 104. The micro-structures 128 of the micro-structured boiling surface 126 (FIG. 2) define numerous vapor bubble nucleation sites 130 (FIG. 3) distributed evenly across the boiling surface 126. By providing the micro-structured boiling surface 126 on the bottom wall 114, a number density per unit area of the vapor bubble nucleation sites 130 is dramatically increased for wetting fluids 106 as compared to that of many existing flow boiling heat exchangers employing a generally smooth boiling surface devoid of micro-structures. In other embodiments, the micro-structured boiling surface 128 can be chemically (or equivalent) formed, leading to a judicious mix of wetting and non-wetting microstructured surfaces.

Figure 3:
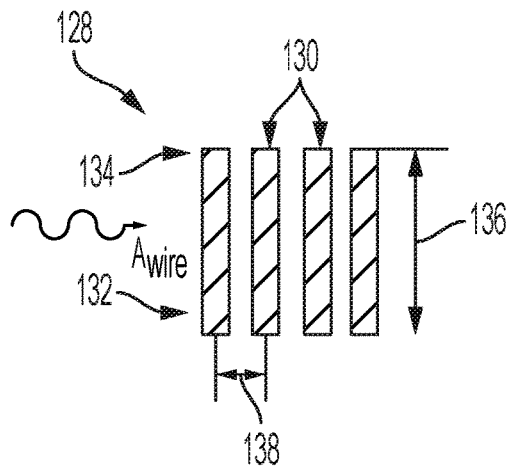
FIG. 3 is a cross-sectional schematic illustration of a micro-structured boiling surface of the microchannel of FIG. 2, taken along line 3-3 of FIG. 2.

As schematically illustrated in cross-section in FIG. 3, the interconnected micro-structures 128 include a base 132 attached to the bottom wall 114, and a distal end 134 opposite the base 132. A micro-structure height 136 is measured between the base 132 and the distal end 134, and a micro-structure spacing 138 measured between adjacent micro-structures 128. The illustrated micro-structured boiling surface 126 includes a micro-structure height 136 of approximately 450 and a micro-structure spacing 138 of approximately 150 μm.

In the illustrated embodiment, the interconnected micro-structures 128 of the illustrated microchannel 104 are formed by affixing a micro-structured mesh 140 (FIG. 5A) to the bottom wall 114 to create the micro-structured boiling surface 126. In some embodiments, this can be performed by diffusion bonding one or more layers of the micro-structured mesh 140 (e.g., four layers) to the bottom wall 114. The illustrated mesh 140 is formed from the same material as the bottom wall 114 (e.g., a material having high thermal conductivity, such as copper), although other mesh materials are also possible. In some embodiments (not shown), the distal end 134 (FIG. 3) may be made of a porous layer of the metal used.

Figure 4:
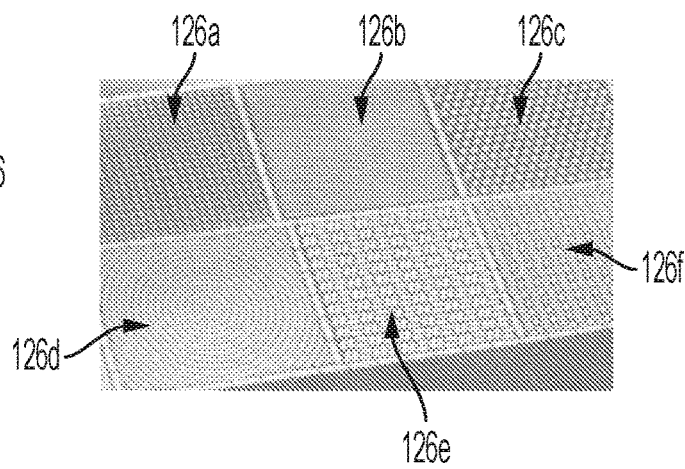
FIG. 4 is a perspective view of alternative micro-structured boiling surfaces for use with the microchannel of FIG. 2.
Figure 5E:
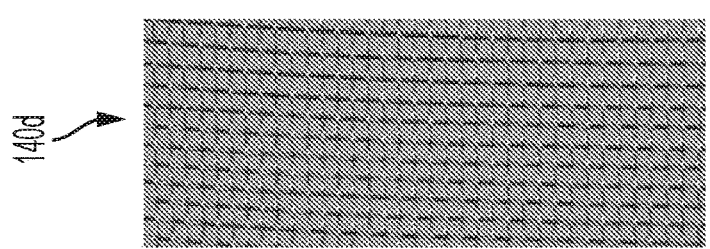
FIGS. 5A-5E are plan views of alternative mesh structures for forming the micro-structured boiling surface of FIG. 3.
Figure 5D:
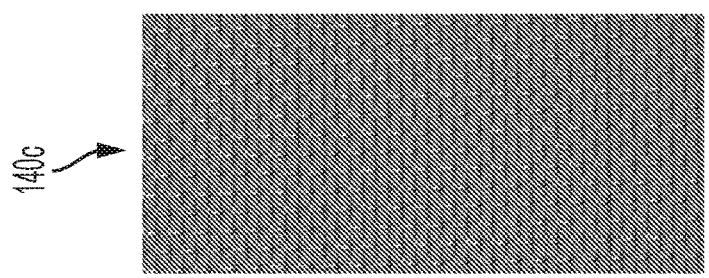
Figure 5C:
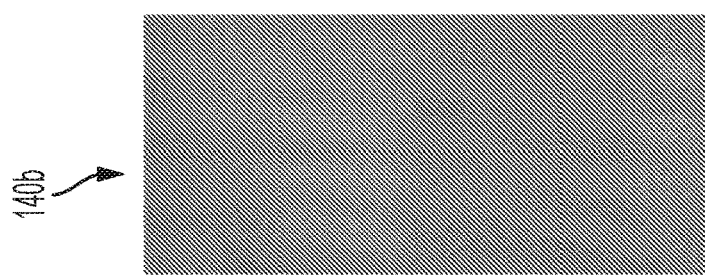
Figure 5B:
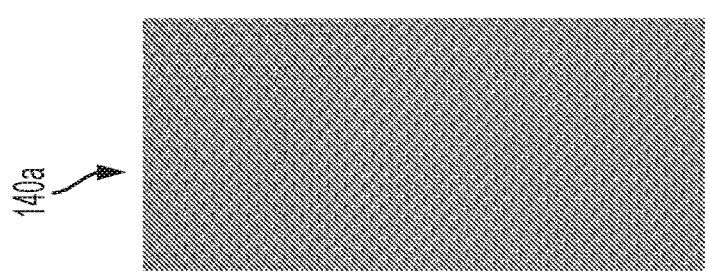
Figure 5A:
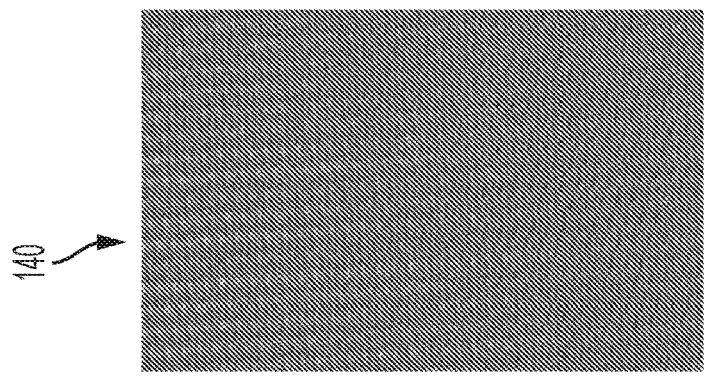

FIG. 4 illustrates additional, non-limiting examples of micro-structured boiling surfaces 126a-126f. While several variations in height, spacing, and pattern are possible, each of the illustrated interconnected micro-structures defining the boiling surfaces 126a-126f increase the vapor bubble nucleation site density. FIGS. 5B-5E illustrate additional, non-limiting examples of various micro-structured meshes 140a-140d which may be utilized to form the micro-structured boiling surface 126.

Figure 6:
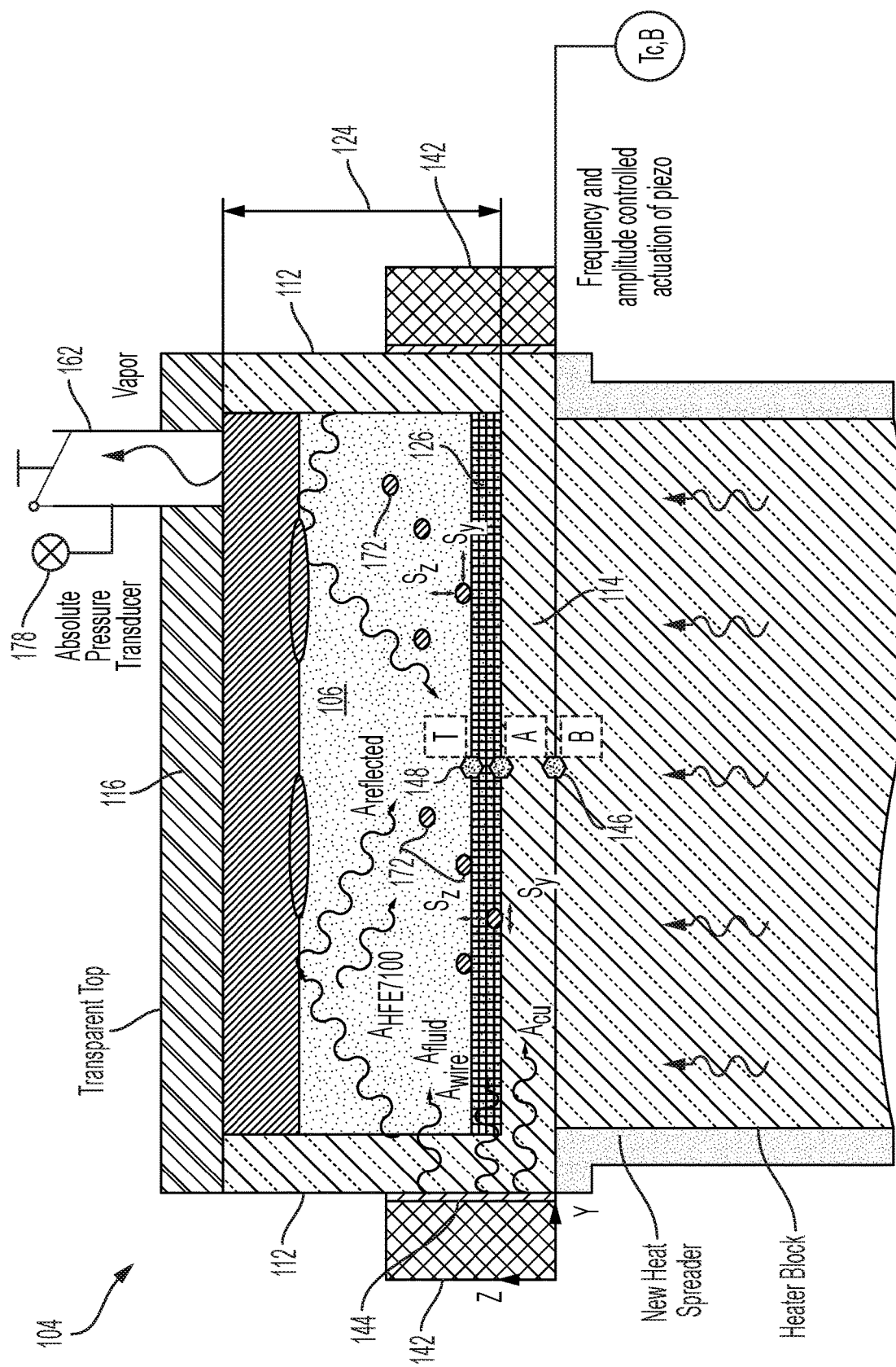
FIG. 6 is a schematic cross-sectional view of the microchannel of FIG. 2, taken along line 3-3 of FIG. 2.

With reference to FIG. 6, the illustrated cooling unit 100 also includes piezoelectric-transducers 142 (hereinafter, "piezos 142") mechanically and acoustically coupled to each sidewall 112. In the illustrated embodiment, the piezos 142 are located external to the microchannels 104. Each piezo 142 includes an output face 143 facing toward an interior of each respective microchannel 104. The piezos 142 are arranged transverse to the micro-structured boiling surface 126, so as to direct acoustic waves incident on the micro-structured boiling surface 126 (i.e., so as to propagate within a plane defined by the boiling surface 126), as well as incident on its upper and lower vicinities. The upper vicinity includes the cooling fluid 106 flowing through the microchannel 104. As shown in FIG. 8, in the illustrated embodiment, a pair of piezos 142 are associated with each microchannel 104, with the output faces 143 of each piezo 142 of the associated pair facing inward toward the interior of the microchannel 104, and facing toward each other. In other embodiments (not shown), just a single piezo 142 can be associated with each respective microchannel 104. In further embodiments, more than two piezos 142 can be associated with each microchannel 104. An acoustic gel 144 is disposed between each piezo 142 and each associated sidewall 112 to facilitate the transmission of acoustic waves into the microchannel 104. In some embodiments, each sidewall 112 can have a thickness T (FIG. 8) close to a quarter wave-length for that material. As shown in FIG. 2, each piezo 142 extends along a direction of the height 124, so as to overlap the base plate 108, the micro-structured boiling surface 126 (as shown in FIG. 6), and a portion of the interior of the microchannel 104 through which the cooling fluid 106 flows. Each piezo 142 likewise extends along a direction of the length 120 (FIG. 2) and overlaps much of the length 120 of each microchannel 104.

In the illustrated embodiment, the piezos 142 are transverse mode piezoelectric transducers 142 (e.g., PZT-5A type) having a resonant frequency $f_p=(\Delta t_{piezo})^{-1}$. In the present embodiment, the resonant frequency $f_p$ is about 1 megahertz (MHz), although other types of piezoelectric transducers having resonant frequencies other than 1 MHz are also contemplated. The transverse mode piezos 142 are arranged and oriented, as described above, to introduce longitudinal acoustic waves in the base plate 108, in the micro-structured boiling surface 126, and within the adjacent cooling fluid 106. The acoustic waves (typically in the 1-2000 Hz range) are introduced by interference of waves obtained by modulating, at acoustic wave frequencies, the natural resonant frequency $f_p$ (about 1 MHz) transverse waves from the piezos 142. These tunable modulations are obtained by an "on-off" frequency superposition (or equivalent) available with the controller driving the piezos 142. This approach of arriving at acoustic range modulation frequencies are also effective in significantly reducing noise-levels associated with such signals (this is because most of the energies are at inaudible frequency ranges).

The piezos 142 are operable to introduce acoustic waves $A_{wire}$, $A_{cu}$, and $A_{fluid}$ (FIG. 6) at modulation frequencies appropriate for inducing resonance with the "in-plane" natural frequencies of the micro-structured boiling surface 126, frequencies associated with aggregate microbubble ebullition cycles on the boiling surface 126, and suitable hydrodynamic acoustic force frequencies that act on the microbubbles when formed within the cooling fluid 106, respectively. The acoustic waves $A_{wire}$, $A_{cu}$, and $A_{fluid}$ are "in-plane" acoustic waves, meaning they are dominant in planes defined by the micro-structured boiling surface 126 as well as in planes parallel thereto. In the embodiment shown in FIG. 6, the in-plane acoustic waves propagate back and forth between the opposed sidewalls 112 and are dominant in directions indicated in FIG. 6 as $A_{wire}$, $A_{cu}$, and $A_{fluid}$ and in FIG. 3 as $A_{wire}$. As will be further discussed below, differences in the amplitude and energy of the acoustic waves $A_{wire}$, $A_{cu}$, and $A_{fluid}$ result in the introduction of oscillatory in-plane shear stresses $S_x$ and $S_y$ (FIGS. 6 and 7) at the micro-structured boiling surface 126.

Figure 7:
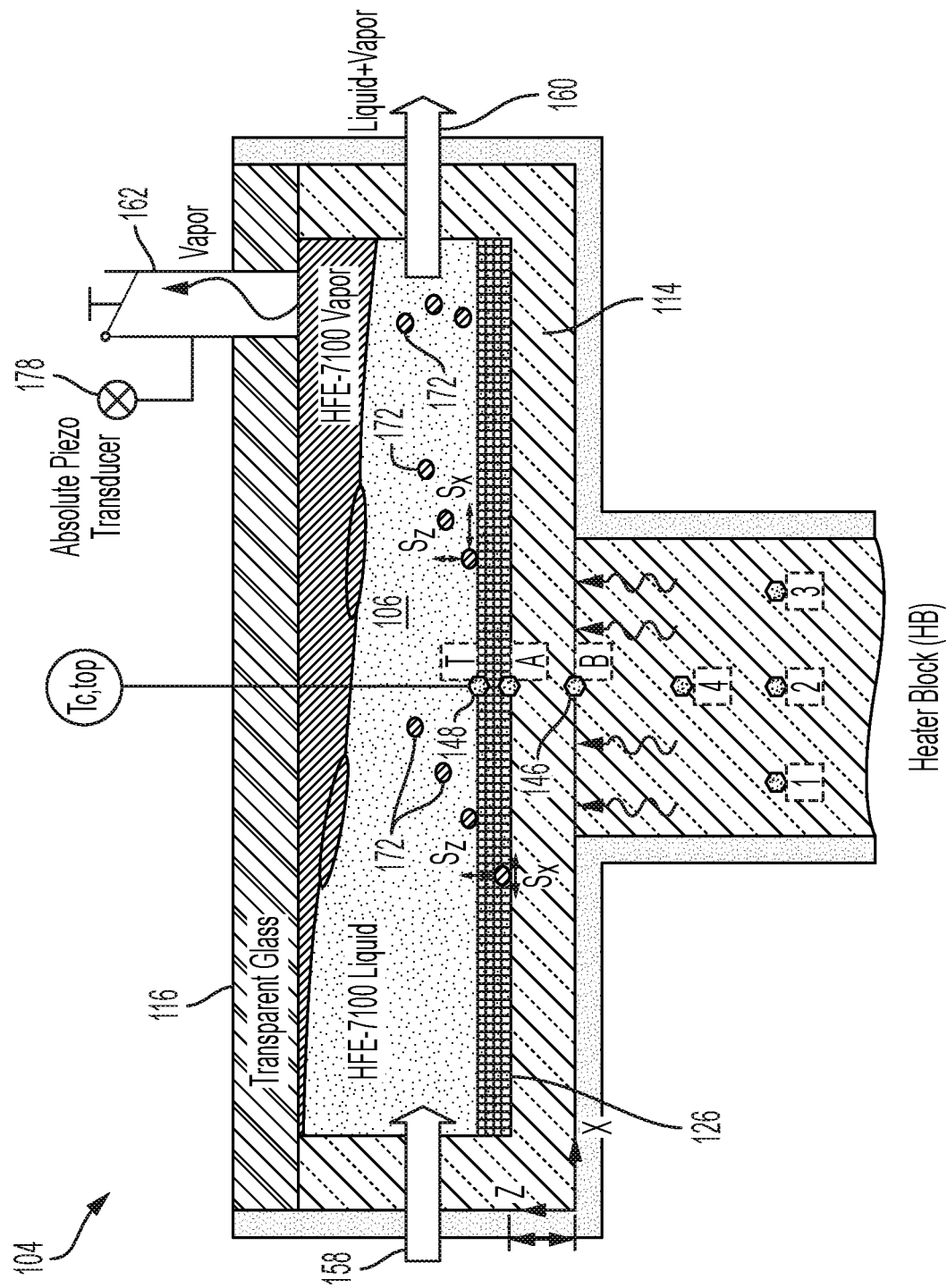
FIG. 7 is another schematic cross-sectional view of the microchannel of FIG. 2, taken along line 7-7 of FIG. 2.

With reference to FIGS. 6 and 7, the cooling unit 100 includes one or more temperature sensors disposed within or without one or more of the microchannels 104 for detecting operating temperatures of the cooling unit 100 at one or more locations. In the illustrated embodiment, a first temperature sensor 146 is positioned at a bottom face of the base plate 108, where the base plate 108 interfaces with the heat source 102. A second temperature sensor 148 is positioned within the microchannel 104 (e.g., at the micro-structured boiling surface 126). The temperature sensors 146, 148 communicate temperature information to a controller 150 (FIG. 16) associated with the cooling unit 100 (FIGS. 1 and 8), as will be discussed in further detail below.

Figure 1B:
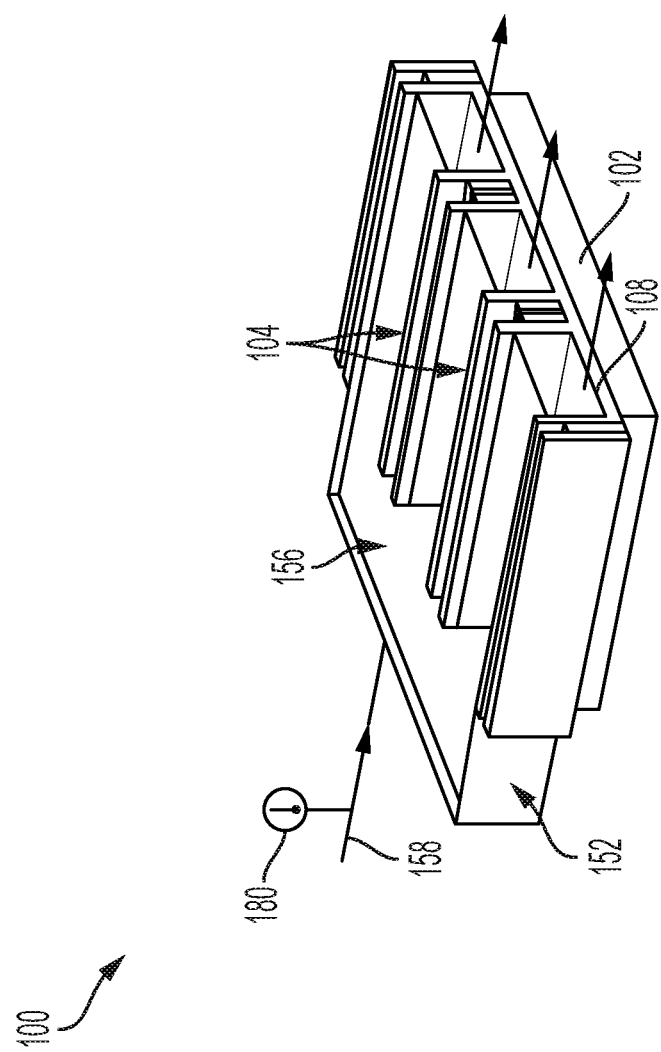
FIG. 1B is a cross-sectional perspective view of the cooling unit of FIG. 1A, taken along line 1B-1B of FIG. 1A.

With reference to FIGS. 1A and 1B, in addition to the microchannels 104, the cooling unit 100 also includes an inlet header section 152 and an outlet header section 154 disposed at opposite ends of the cooling unit 100. Each header section 152, 154 forms a compartment or cooling fluid collection area 156, and the inlet header section 152 fluidly communicates with the outlet header section 154 via the microchannels 104. The inlet header section 152 includes an inlet port 158 by which the cooling fluid 106 enters the inlet header section 152, and the outlet header section 154 includes a primary outlet port 160 (FIG. 12) by which some or all of the cooling fluid 106 exits the outlet header section 154. An inlet temperature sensor 180 is located at or near the inlet port 158 to detect a temperature of the cooling fluid 106 entering the cooling unit 100.

With reference to FIG. 7, in addition to the primary outlet port 160 (for mostly liquid flows), the outlet header section 154 also includes a secondary outlet port 162 (for mostly vapor flows) that provides a second exit for the cooling fluid 106 to leave the cooling unit 100. The secondary outlet port 162 is located closer to the top plate 110 (FIG. 1A) than is the primary outlet port 160. In some embodiments, the secondary outlet port 162 is provided in the top plate 110. As will be discussed further below, during operation of the cooling unit 100, at least some of the cooling fluid 106 flowing through the cooling unit 100 undergoes a phase change from liquid to vapor, due to the enhanced flow boiling occurring within the microchannels 104. The cooling fluid 106 that remains mostly in the liquid state exits the cooling unit 100 via the primary outlet port 160, and the cooling fluid 106 that changes to a vapor state exits the cooling unit 100 primarily via the secondary outlet port 162. The secondary outlet port 162 helps to suppress system-level instabilities that otherwise may result from having only a primary outlet port 160. An absolute pressure transducer 178 is positioned within the secondary outlet port 162 to detect the pressure within the cooling unit 100.

FIG. 8 is a cross sectional view illustrating the cooling unit 100 mounted on a microchip 164. The microchip 164 is coupled to a substrate 166 (e.g., a circuit board such as a server board). In some embodiments, a thermally conductive material (TIM) 168 is disposed between a top surface of the microchip 164 and a bottom surface of the base plate 108 to reduce a thermal resistance of the assembly. During operation, the microchip 164 generates waste heat (e.g., at an average heat flux of 6 W/cm$^2$, roughly equivalent to that of an Intel Xeon® processor) that is conducted through the TIM 168 (if present), the base plate 108, and toward the micro-structured boiling surface 126.

FIG. 8 also illustrates interstitial spaces 170 defined between the sidewalls 112 of adjacent microchannels 104. In the illustrated embodiment, two piezos 142 are located within each interstitial space 170 between two adjacent microchannels 104, with the two piezos 142 facing opposite directions so as to direct acoustic waves toward an interior of each respective microchannel 104 of the two adjacent microchannels 104.

In operation, heat generated by the heat source 102 (e.g., the microchip 164; FIG. 8) is conducted toward the micro-structured boiling surface 126. The piezos 142 are energized to introduce acoustic waves $A_{cu}$ and $A_{wire}$ to resonate the base plate 108 and the micro-structured boiling surface 126, respectively. When energized, the piezos 142 also introduce acoustic waves $A_{fluid}$ to excite the cooling fluid 106. The cooling fluid 106, having an inlet quality of zero (i.e., all liquid phase), enters the cooling unit 100 through the inlet port 158 at a temperature just below the saturation temperature (e.g., 2-3° C. subcooled). Subcooled cooling fluid 106 is supplied below the saturation temperature to ensure proper flow-loop operations and purely liquid phase cooling fluid 106 entering the cooling unit 100. The cooling fluid 106 is not significantly sub-cooled, which could potentially impair the cooling efficiency of the cooling unit 100. The liquid phase cooling fluid 106 passes through the collection area 156 of the inlet header section 152 and flows into the microchannels 104 (FIG. 1B). As the liquid phase cooling fluid 106 flows through each microchannel 104, the cooling fluid 106 interacts with the micro-structured boiling surface 126 such that microbubbles 172 (FIG. 6) begin to form at the microbubble nucleation sites 130 (FIG. 3) distributed on the micro-structured boiling surface 126. As the microbubbles 172 nucleate, grow, and detach from the nucleation sites 130, heat energy is carried away from the micro-structured boiling surface 126 due to the enthalpy associated with the phase change of the cooling fluid 106 from liquid to vapor phase.

Figure 19A:
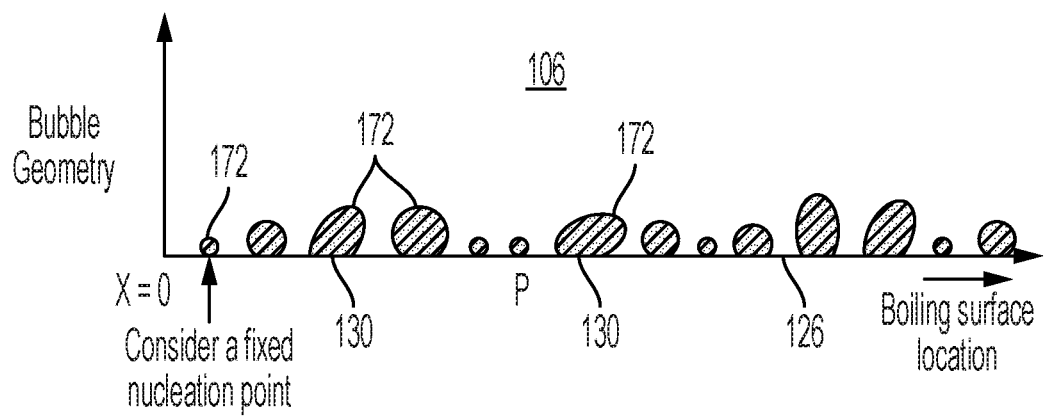
FIG. 19A is a schematic illustration of vapor microbubbles forming on and detaching from the micro-structured boiling surface of FIG. 3 at a certain instant.
Figure 19B:
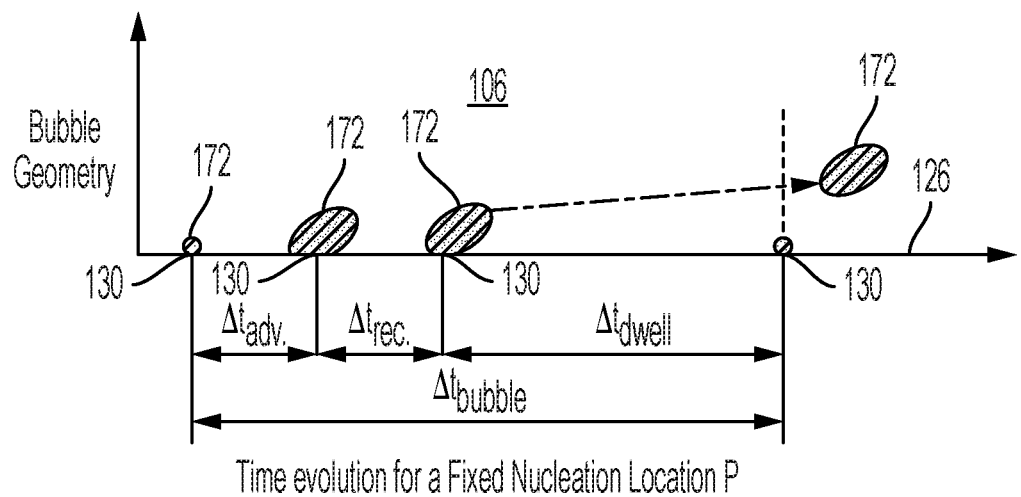
FIG. 19B is another schematic illustration of a single vapor microbubble forming on and detaching from the micro-structured boiling surface of FIG. 3.

FIGS. 19A and 19B respectively illustrate spatial and temporal schematics of micron-scale microbubbles 172 (e.g., having diameters of 10 μm or less) forming on the micro-structured boiling surface 126 and detaching therefrom during the flow boiling process occurring within the microchannels 104. With reference to FIG. 19A, at any instant time t, micron-scale microbubbles 172 are forming or otherwise residing, at various stages of development, at the nucleation sites 130 of the micro-structured boiling surface 126. With reference to FIG. 19B, for a single fixed nucleation site 130, a time evolution of a single microbubble 172 is described. The microbubble 172 forms at t=0. The microbubble 172 enlarges in volume during a growth stage $\Delta t_{adv}$, and then the microbubble 172 begins to separate from the nucleation site 130 during a detachment stage $\Delta t_{rec}$. At the end of the detachment stage $\Delta t_{rec}$, the microbubble 172 detaches from the nucleation site 130. The nucleation site 130 then undergoes a period of dormancy $\Delta t_{dwell}$ during which there is no microbubble forming at the nucleation site 130. At the end of the dormancy period $\Delta t_{dwell}$, a new microbubble begins to form at the nucleation site 130 and the process is repeated. Resonance is induced for the micro-structures 128 on the base plate 108 by the acoustic waves $A_{cu}$ and $A_{wire}$ (generated by the piezos 142) incident on the micro-structured boiling surface 126. As discussed above, the acoustic waves $A_{cu}$ and $A_{wire}$ mechanically stimulate or actuate the detachment of the microbubbles 172 from the nucleation sites 130. In turn, this reduces the duration of the overall time evolution of the microbubble 172, resulting in faster flow boiling and improved heat transfer from the micro-structured boiling surface 126 to the cooling fluid 106.

As discussed above with respect to FIGS. 2 and 3, the interconnected micro-structures 128 defining the micro-structured boiling surface 126 contribute to a far greater density of microbubble nucleation sites 130 distributed about the micro-structured boiling surface 126, as compared to boiling surfaces of traditional flow boiling heat exchangers. The relatively greater nucleation site density enhances the rate of microbubble formation and detachment during operation of the cooling unit 100. As a result, a cooling capacity of the cooling unit 100 is increased—while retaining the liquid wettability—as compared to traditional flow boiling heat exchangers lacking micro-structured boiling surfaces.

Differences in the amplitude and energy of the acoustic waves $A_{cu}$, $A_{fluid}$, and $A_{wire}$ (FIGS. 6-7) further aid in the introduction of oscillatory in-plane shear stresses $S_x$ and $S_y$ at the micro-structured boiling surface 126. The oscillatory shear stresses $S_x$ and $S_y$ (along with a suitable but limited extent of distal tip 134 (FIG. 3) undergoing in plane vibrations) facilitate in providing resonance opportunities associated with the bubble ebullition cycle frequencies (FIG. 17B) towards the dislodging of the micron-sized microbubbles 172 from the nucleation sites 130 to enhance flow boiling. The frequency and energy content of the waves $A_{cu}$, $A_{fluid}$, and $A_{wire}$ are tuned, by exploration, to the typically unknown aggregate natural frequencies (or a range of frequencies) associated with various nucleation processes of the microbubbles 172, and with the mesh micro-structures 128 defining the micro-structured boiling surface 126. In addition, the standing waves within the liquid phase cooling fluid 106 near the saturation temperature can provide additional hydrodynamics forces for dislodging the microbubbles 172. Introducing oscillatory shear stresses $S_x$ and $S_y$ using transverse mode piezos 142 arranged and oriented as described above was assessed to be superior as compared to use of commercially available shear mode piezos.

The microbubbles 172 forming and detaching during the flow boiling process introduce vapor phase cooling fluid 106 into the microchannels 104. As the cooling fluid 106 passes through the microchannels 104 and undergoes flow boiling, the amount of vapor phase cooling fluid 106 increases while the amount of liquid phase cooling fluid 106 simultaneously decreases. Accordingly, the cooling fluid 106 has a non-zero outlet quality (i.e., at least some vapor phase cooling fluid 106 is present) upon reaching the fluid collection area 156 of the outlet header section 154. In some embodiments, the outlet quality of the cooling fluid 106 can be in the range of 0.05-1.00. In other embodiments, the flow rates are matched to heat loads and the outlet quality is kept in the range of 0.4-0.6 in order to avoid certain dry-out related and other types of flow instabilities.

After reaching the fluid collection area 156 of the outlet header section 154, the cooling fluid 106 then exits the cooling unit 100 via one or both of the primary and secondary outlet ports 160, 162. In the illustrated embodiment, a mixture of vapor and liquid phase cooling fluid 106 exits the cooling unit 100 through the primary outlet port 160, while predominantly vapor phase cooling fluid 106 exits through the secondary outlet port 162.

FIGS. 9-11 and 20 depict graphs showing temperature and pressure data collected while operating the microchannel 104 shown in FIG. 2. A top face temperature 174 was measured by the second temperature sensor 148 positioned at the micro-structured boiling surface 126, and a vapor pressure 176 was measured by the absolute pressure transducer 178 located within the secondary outlet port 162.

Figure 9:
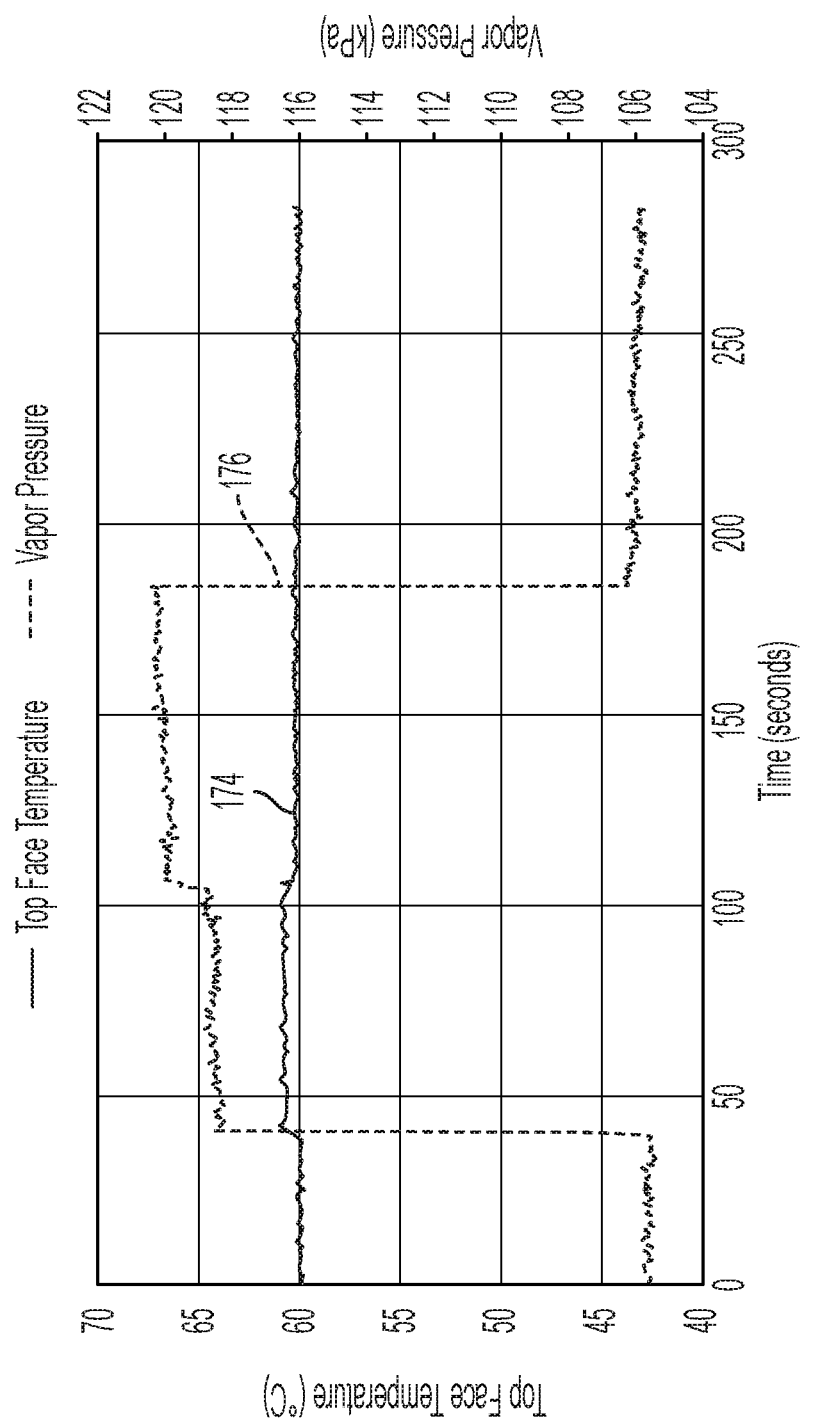
FIGS. 9-11 are graphs illustrating temperature and pressure information associated with piezos-actuated enhanced flow-boiling operation of the microchannel of FIG. 2.

With reference to FIG. 9, in one test, the microchannel 104 was initially operated with the piezos 142 switched off from time=0 seconds until time=40 seconds. During this initial time period, the top face temperature 174 remained relatively constant at about 60° C., and the vapor pressure 176 likewise held stable at about 106 kPa. At time=40 s, both of the two piezos 142 associated with the microchannel 104 were switched on. A rapid increase in the vapor pressure 176 was detected within the microchannel 104 in response to activation of the piezos 142, increasing from about 106 kPa to about 120 kPa. However, the top face temperature 174 continued to measure near 60° C. after the piezos 142 were switched on. At time=180 s, both piezos 142 were switched off, and the vapor pressure 176 rapidly fell back toward 106 kPa. The rapid increase in vapor pressure 176 in response to activation of the piezos 142 is attributable to an increase in the rate of microbubble nucleation, growth, and detachment while the liquid flow rate (FIG. 12) downstream of the condenser and upstream of the inlet 158 stayed constant. The microbubble nucleation rates are stimulated by the acoustic waves $A_{cu}$, $A_{fluid}$, and $A_{wire}$ produced by the piezos 142, which produce the in-plane shear stresses $S_x$ and $S_y$ and help to dislodge the microbubbles 172 from the nucleation sites 130, as discussed above. Flow boiling is enhanced within the microchannel 104 and, as a result, more of the cooling fluid 106 undergoes a phase change from liquid to vapor phase. The increase in vapor phase cooling fluid 106 produced within the microchannel 104 accounts for the increase in vapor pressure 176 measured by the absolute pressure transducer 178. The fact that the top face temperatures remain close to saturated temperature is indicative of high HTC that corresponds to an effectively very thin time-average liquid film thickness (associated with $\Delta t_{dwell}$ in FIG. 19) wetting the boiling surface 126 while the RTD sensor probe remains, primarily, vapor blanketed (perhaps with even thinner liquid film coating the probe surface).

Figure 10:
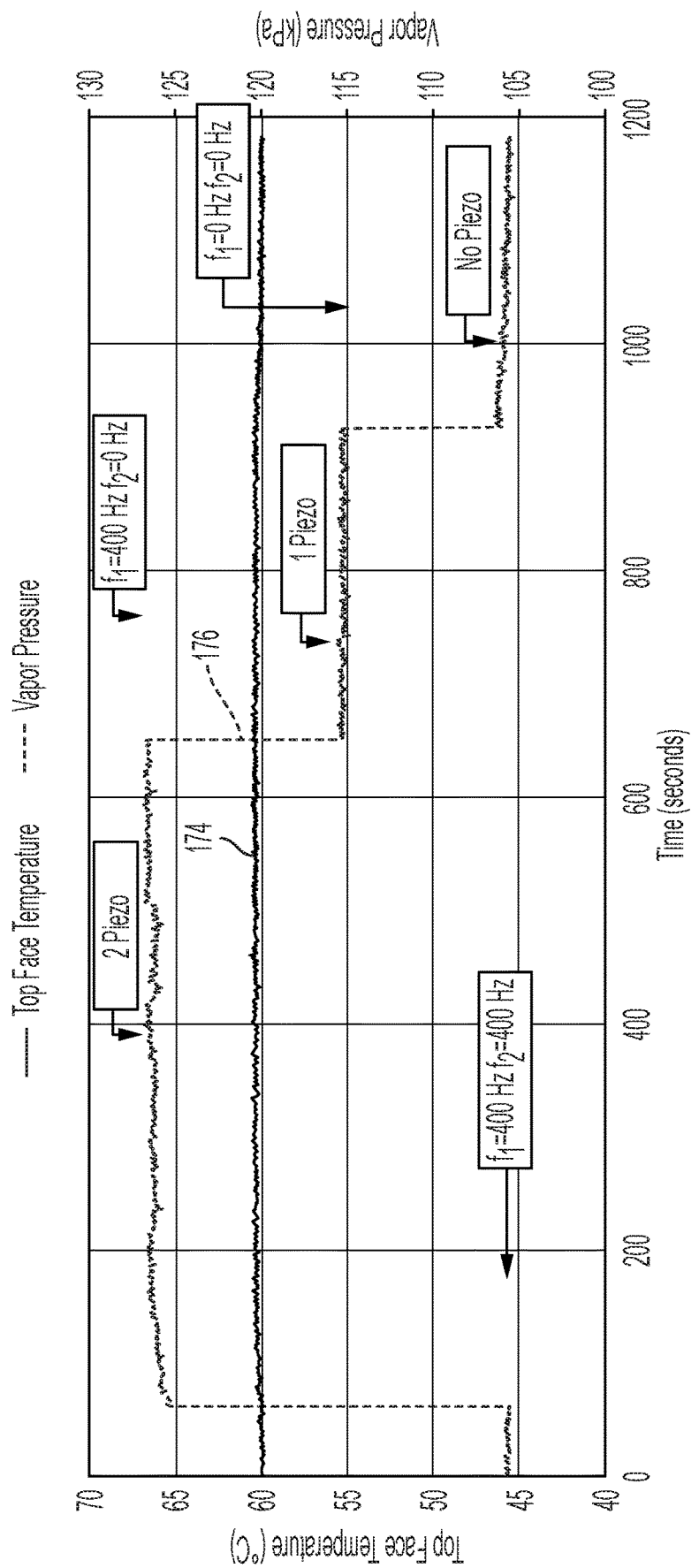

With reference to FIG. 10, in another test, the microchannel 104 was likewise initially operated with the piezos 142 switched off. At about time=60 s, both piezos 142 were switched on. At about time=660 s, one piezo 142 was switched off while the other piezo 142 remained on. At about time=920 s, the remaining active piezo 142 was also switched off. As can be seen in FIG. 10, a rapid increase in vapor pressure 176 was observed coinciding with activation of both of the piezos 142, from about 105 kPa to about 125 kPa. Upon switching one of the piezos 142 off, the measured vapor pressure 176 decreased from about 125 kPa to about 115 kPa, but remained higher than the initial period when both piezos 142 were switched off.

Figure 11:
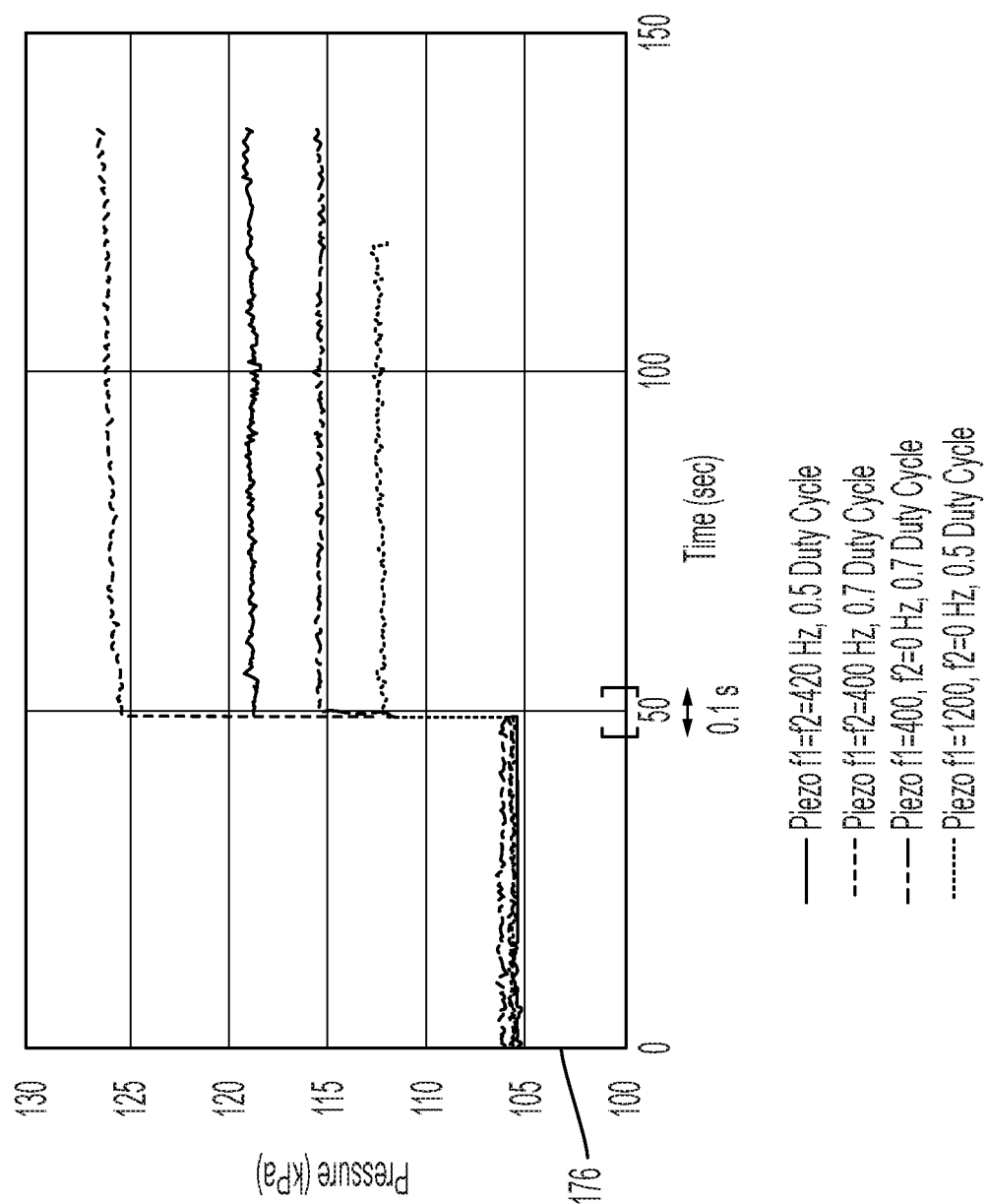

With reference to FIG. 11, multiple tests were conducted with the microchannel 104 with one or both of the piezos 142 switched on, and while varying the frequency and duty cycle of the piezos 142. The results of these tests further demonstrate additional enhanced potentials and rapid increases in vapor pressure in response to activation of the piezos 142. These pressure rises also correspond to significant HTC improvements in flow boiling performances relative to flow boiling performed without piezos but still employing the micro-structured boiling surface. Preliminary experimental results shown in FIG. 20 (which is a driving temperature difference versus average heat-flux plot) curves are quite reliable (within ±10-20% accuracy in driving temperature-differences) at heat-flux values in the immediate vicinity of 30 W/cm². The curves in this vicinity show an approximate HTC improvement of 132% for the micro-structured boiling surface case over the smooth plane copper case (which is at about 6277 W/m²-° C.) and a further 287% HTC improvements for the piezos-actuated cases (reaching up to 56530 W/m²-° C.) relative to the passive (no piezos actuation) meshed-copper case). While the trends of the extrapolated curves are not experimental, they are representative and are being established.

Figure 20:
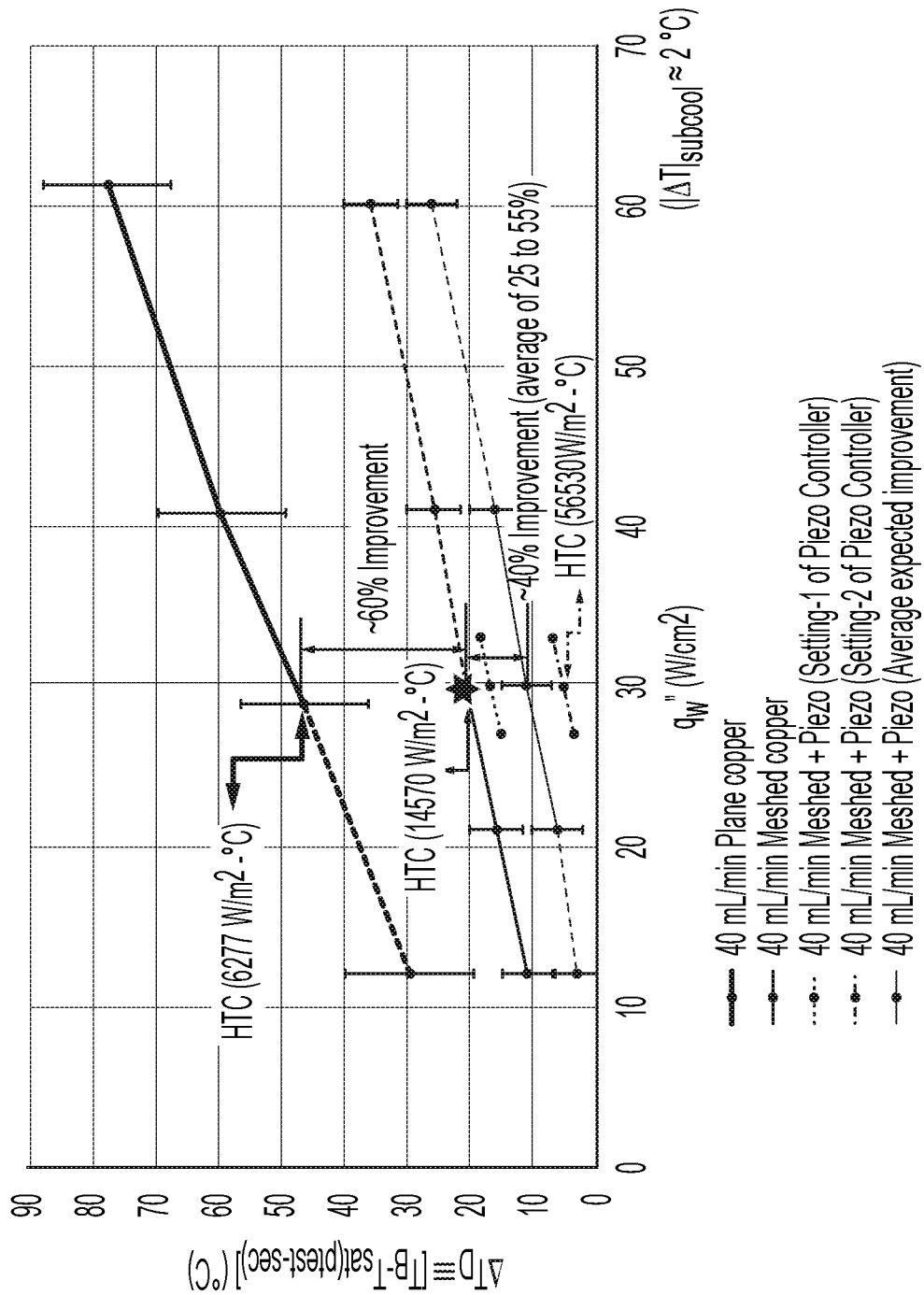
FIG. 20 is a graph illustrating reductions in driving temperature-differences for a given heat flux associated with operation of the microchannel of FIG. 2.

With reference to FIG. 20, multiple tests were conducted with the microchannel 104 for a smooth boiling surface with the piezos 142 switched off, for the micro-structured boiling surface 126 with the piezos 142 switched off, for the micro-structured boiling surface 126 with the piezos 142 operating at a first setting, and for the micro-structured boiling surface 126 with the piezos 142 operating at a second setting. The results of these tests are provided by FIG. 20 and demonstrate that both the micro-structured boiling surface 126 and the piezos 142 improve the efficiency of the flow boiling process and yield higher heat transfer rates q at lower temperature differences $\Delta T$.

With some modifications, the flow boiling approach utilizing micro-structuring and piezos-based enhancement of micro-nucleation rates as described above, can likewise significantly improve the performances of other pool-boiling based immersion cooling methods available in the market (e.g. from Iceotope, etc.).

Figure 12:
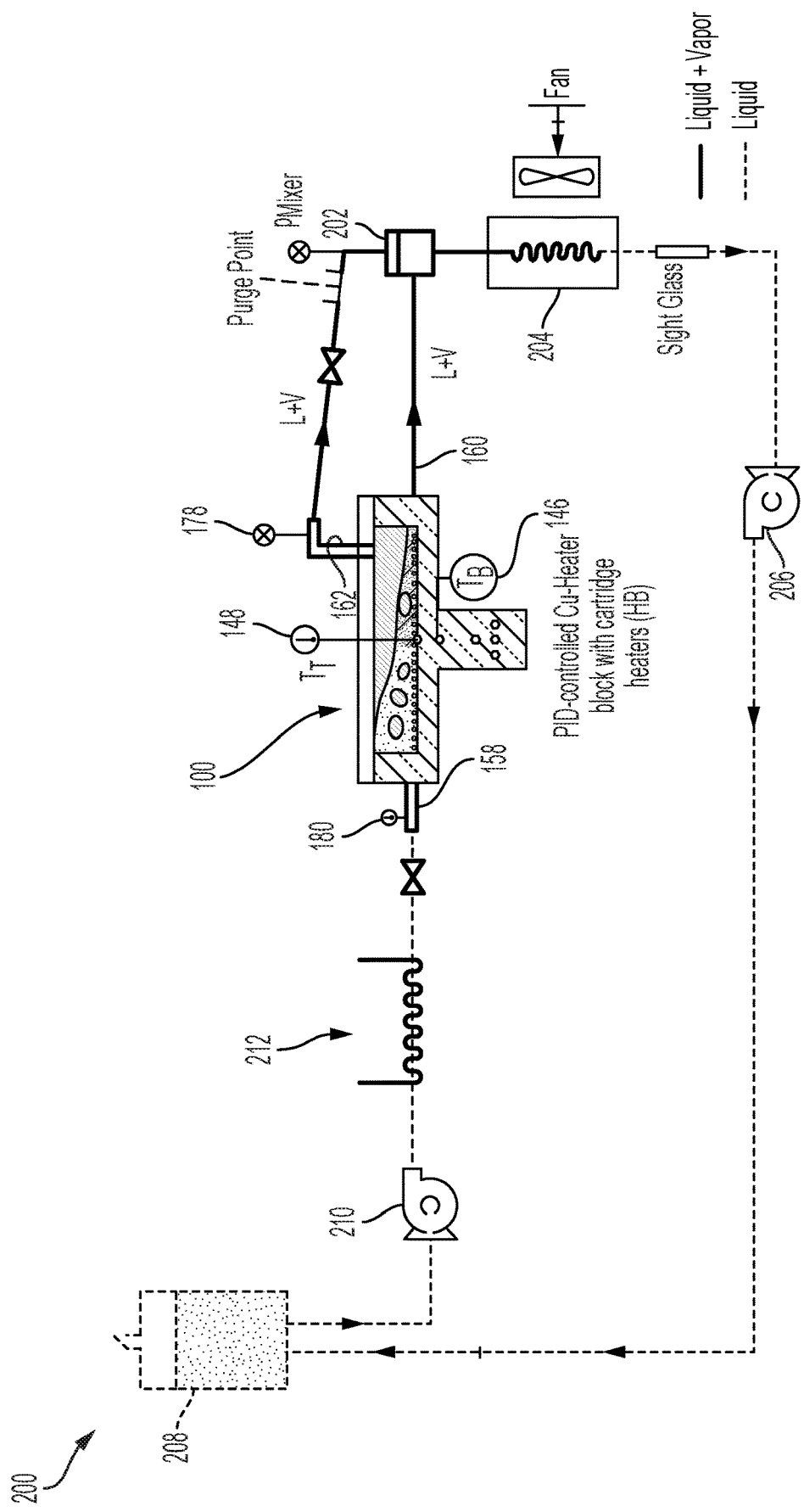
FIG. 12 is a schematic illustration of an exemplary cooling loop that incorporates the cooling unit of FIG. 1A.

FIG. 12 illustrates an exemplary cooling loop 200 that incorporates the cooling unit 100. The cooling loop 200 is provided as an example of one implementation of the cooling unit 100, but many other systems are possible for supplying, removing, and processing the cooling fluid 106 utilized by the cooling unit 100. The exemplary cooling loop 200 includes a liquid-vapor mixer chamber 202, a condenser 204, a first pump 206, a reservoir 208, a second pump 210, and a reheat apparatus 212. Cooling fluid 106 exits the cooling unit 100 via the primary and secondary outlet ports 160, 162 and flows to the liquid-vapor mixer chamber 202. From the mixer chamber 202, the cooling fluid 106 is drawn through the condenser 204 by the first pump 206, and cooled to slightly below the saturation temperature of the cooling fluid 106. The cooled cooling fluid 106 continues from the condenser 204 to the reservoir 208. The second pump 210 draws the cooling fluid 106 from the reservoir 208 and directs it toward the cooling unit 100. The second pump 210 also meters the flow rate of the cooling fluid 106 entering the cooling unit 100, to maintain a steady state for the flow boiling process transpiring within the cooling unit 100. The reheat apparatus 212 (e.g., a rope heater) is useful for cases where condenser exit sub-cooling becomes more than an allowed value. The reheat apparatus 212 reheats the cooling fluid 106 as necessary to ensure the cooling fluid 106 enters the cooling unit 100 at a temperature only slightly below the saturation temperature (e.g., 2-3° C. subcooled).

Figure 13:
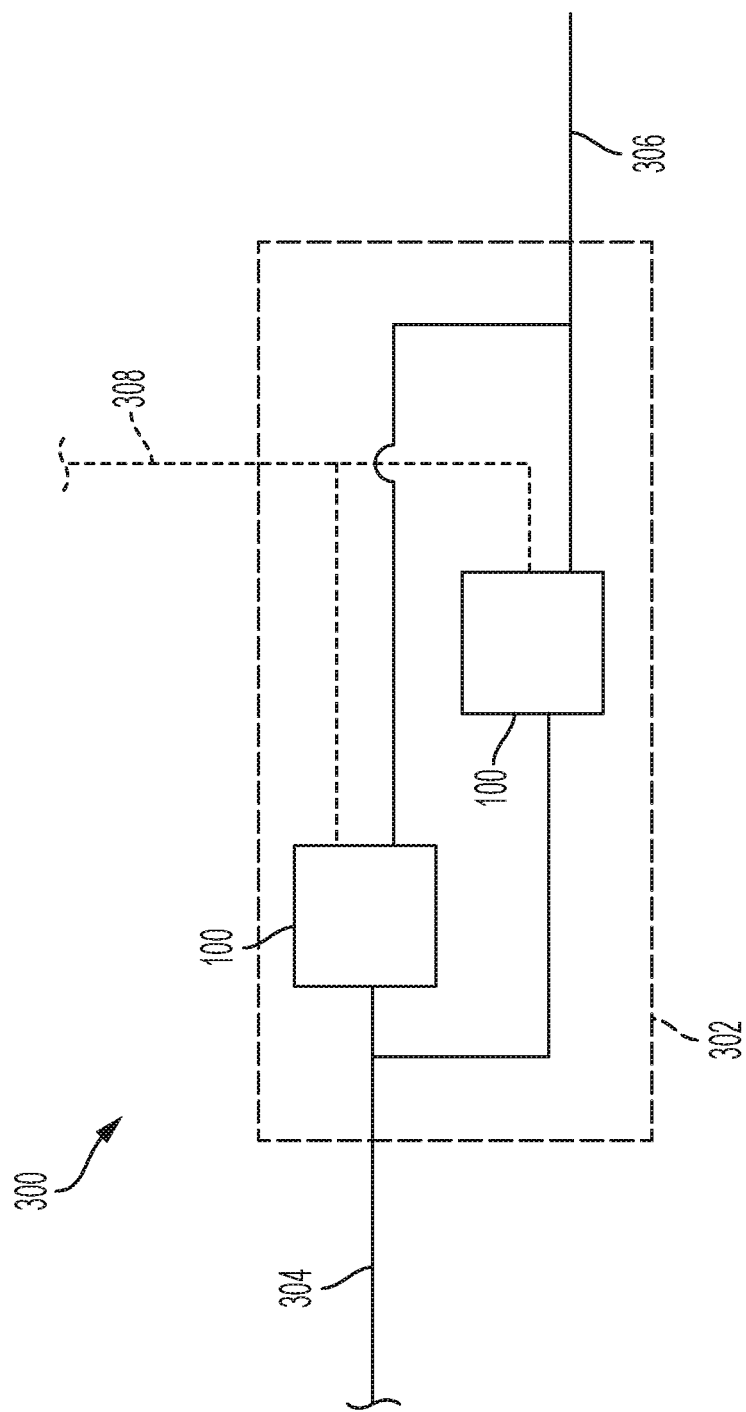
FIG. 13 is a schematic illustration of a server-level cooling subsystem for cooling multiple microchips supported on a server board using the cooling unit of FIG. 1A.

FIG. 13 schematically illustrates a server-level cooling subsystem 300 for cooling multiple microchips supported on a server board 302. The server-level cooling subsystem 300 employs multiple cooling units 100 to cool the microchips supported on the server board 302. The server board 302 can be incorporated into a server rack 402 (FIG. 15) which, in turn, can be utilized within a data center 702 (FIG. 17) for performing various computing operations (e.g., machine learning applications, cloud computing, big data, internet of things, artificial intelligence, etc.). The server-level cooling subsystem 300 includes, in addition to the cooling units 100, a server supply liquid line 304 for supplying cooling fluid 106 to the cooling units 100. The server-level cooling subsystem 300 also includes a first or liquid server return line 306 for carrying away the (primarily liquid phase) cooling fluid 106 from the primary outlet ports 160 of the cooling units 100. The server-level cooling subsystem 300 further includes a second or vapor server return line 308 for carrying away the (primarily vapor phase) cooling fluid 106 from the secondary outlet ports 162 of the cooling units 100.

Figure 14:
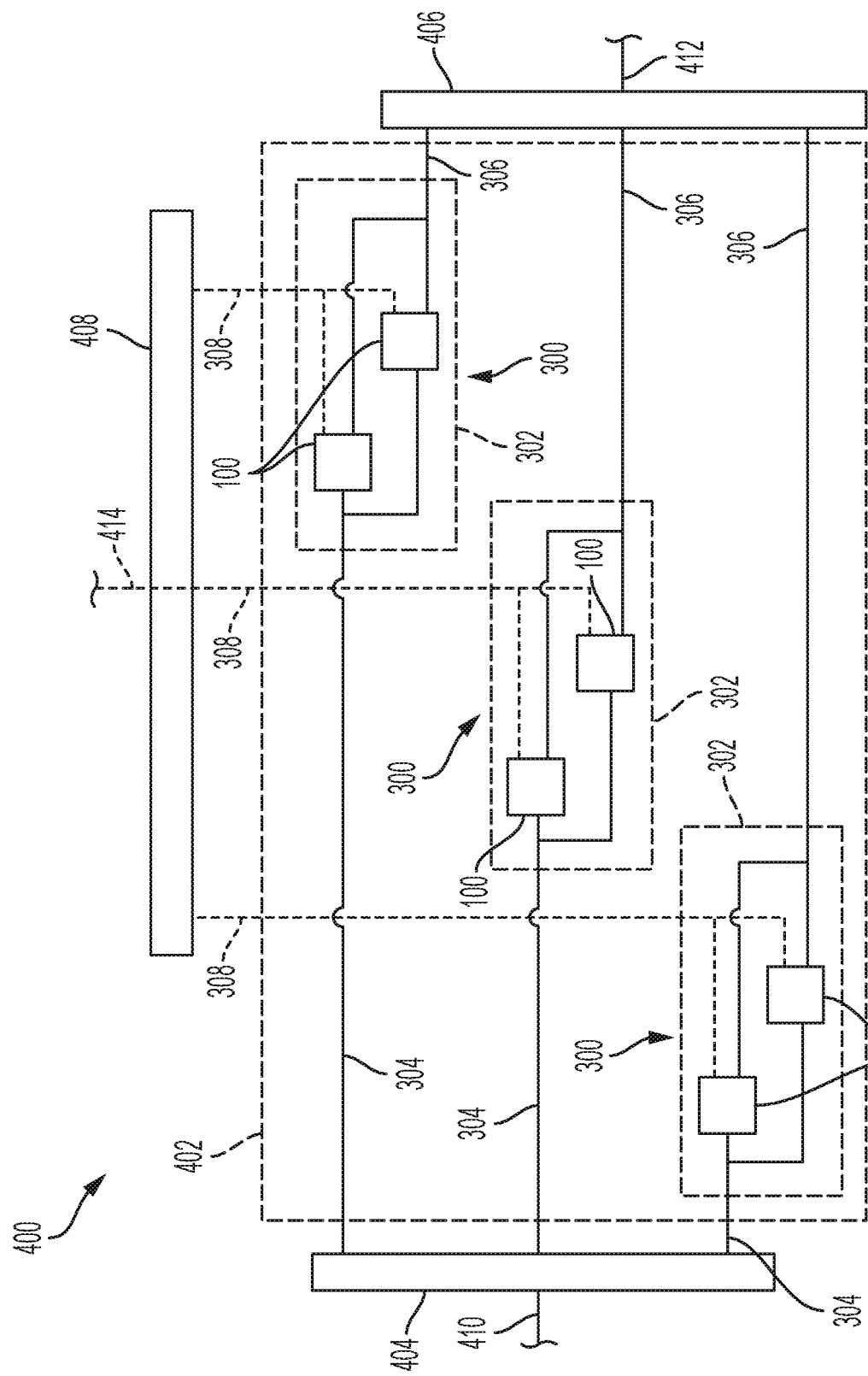
FIG. 14 is a schematic illustration of a rack-level cooling subsystem that incorporates the server-level cooling subsystem of FIG. 13 to cool multiple server boards incorporated into a server rack.

FIG. 14 schematically illustrates a rack-level cooling subsystem 400 for cooling multiple server boards 302 incorporated into the server rack 402. The rack-level cooling subsystem 400 employs multiple server-level cooling subsystems 300 associated with multiple server boards 302. For purposes of illustration, three server boards 302 are shown in FIG. 14, but more server boards are also contemplated in accordance with well-known data center server rack configurations. The rack-level cooling subsystem 400 includes a supply manifold 404, a first or liquid return manifold 406, and a second or vapor return manifold 408. A primary supply line 410 supplies liquid cooling fluid 106 to the supply manifold 404, and multiple server liquid supply lines 304 extend between the supply manifold and each respective server-level cooling subsystem 300 to carry liquid cooling fluid 106 from the supply manifold 404 to each respective server-level cooling subsystem 300. Multiple liquid server return lines 306 carry (at least partly) liquid phase cooling fluid 106 away from each server-level cooling subsystem 300 to the liquid return manifold 406. The cooling fluid 106 exits the liquid return manifold 406 through a primary return line 412. Similarly, multiple vapor server return lines 308 carry primarily vapor phase cooling fluid 106 away from each server-level cooling subsystem 300 to the vapor return manifold 408. The cooling fluid 106 exits the vapor return manifold 408 through a secondary return line 414.

Figure 15:
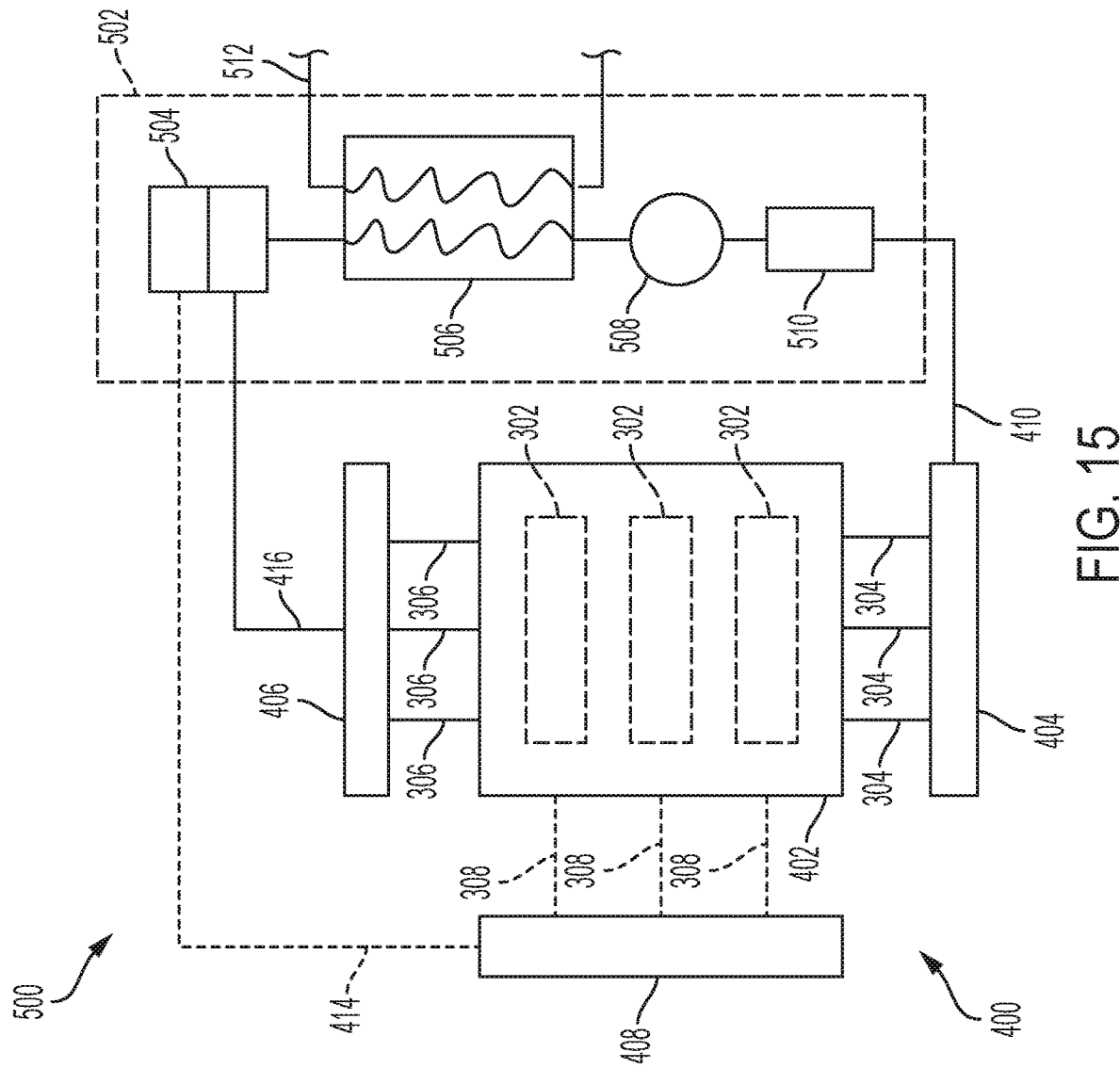
FIG. 15 is a schematic illustration of a server rack cooling loop that incorporates the rack-level cooling subsystem of FIG. 14.

FIG. 15 illustrates a server rack cooling loop 500 for circulating and removing heat from the cooling fluid 106 that flows through the server-level cooling subsystem 300 to cool the server rack 402. In the illustrated embodiment, the server rack cooling loop 500 includes the server-level cooling subsystem 300 (employing multiple server-level cooling subsystems 300 each utilizing one or more cooling units 100), and a cooling distribution unit (CDU) 502. The CDU 502 receives heated and substantially vaporized cooling fluid 106 from the rack-level cooling subsystem 400 via the primary and secondary return lines 412, 414 and supplies subcooled cooling fluid 106 to the rack-level cooling subsystem 400 via the primary supply line 410. The CDU 502 includes a liquid-vapor mixer chamber 504, a heat exchanger 506, one or more pumps 508, and a reheat apparatus 510 (for occasional use as necessary). A data center cooling line 512 is fluidly coupled to the heat exchanger 506 to carry away heat from the cooling fluid 106. In some embodiments, the data center cooling line 512 is part of a heat recovery system 800 (FIGS. 17, 18A and 18B) that is fluidly connected to the heat exchanger 506 (FIGS. 18A and 18B) to draw away heat from the cooling fluid 106. The reheat apparatus 510 reheats the cooling fluid 106, as necessary, to ensure that the cooling fluid 106 is supplied to the rack-level cooling subsystem at a temperature just below the saturation temperature.

Figure 16:
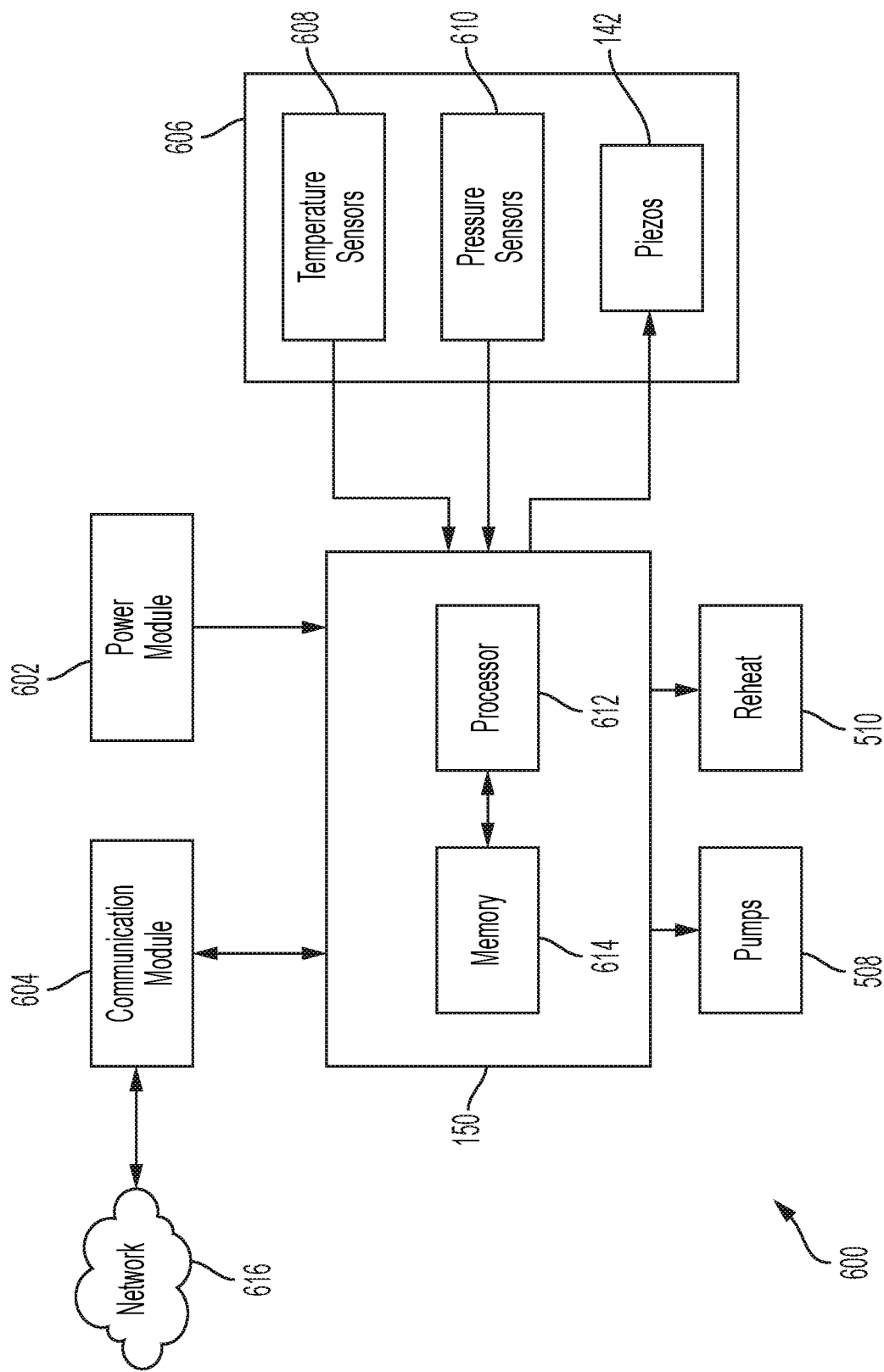
FIG. 16 is a block diagram of an exemplary control system associated with the server rack cooling loop of FIG. 15.

FIG. 16 illustrates a block diagram of an exemplary control system 600 associated with the server rack cooling loop 500 that includes the cooling units 100. The control system 600 includes a controller 150 that is electrically or otherwise communicatively connected to modules or components of the server rack cooling loop 500. For example, the illustrated controller 150 is connected to pumps 508, the reheat apparatus 510, a power supply module 602, a communications module 604, and one or more cooling unit modules 606 associated with the cooling units 100. Each cooling unit module 606 can include one or more temperature sensors 608 (e.g., the first temperature sensor 146, the second temperature sensor 148, the inlet temperature sensor 180, etc.), one or more pressure sensors 610 (e.g., the absolute pressure transducer 178, etc.), and the piezos 142.

The controller 150 (FIG. 16) can include any suitable combination of hardware and software that is operable to, among other things, control the operation of the server rack cooling loop 500 and the piezos 142. The exemplary controller 150 includes a plurality of electrical and electronic components that provide power, operational control and, in some cases, protection to the components and modules within the controller 150 and/or the server rack cooling loop 500. For example, the controller 150 can include, among other things, a processing unit 612 (e.g., a microprocessor, a microcontroller, or another suitable programmable device) and a memory 614, and in some embodiments can be implemented partially or entirely on a semiconductor (e.g., a field-programmable gate array ("FPGA")) chip, such as a chip developed through a register transfer level ("RTL") design process.

The processing unit 612 can be connected to the memory 614 for execution of software instructions that are capable of being stored in the memory 614. Software included in some implementations of the server rack cooling loop 500 can be stored in the memory 614 of the controller 150. In some embodiments, the controller 150 is configured to retrieve from memory and execute, among other things, instructions related to the control processes and methods described herein. As will be appreciated, the controller 150 can include additional, fewer, or different components.

The illustrated communications module 604 is configured to connect to and communicate with other devices (e.g., a computer, a database, another server rack cooling loop, etc.) through a network 616. The connections between the communications module 604 and the network 616 can be, for example, wired connections, wireless connections, or any combination of wireless and wired connections.

The controller 150 (FIG. 16) receives temperature and pressure information from the temperature sensors 608 and the pressure sensors 610 of the cooling unit module 606, and based on that information, executes instructions to maintain desired flow boiling parameters within the cooling units 100. Specifically, the controller 150 can increase or decrease pump speeds of the pumps 508, activate or deactivate the reheat apparatus 510, and control operation of the piezos 142 as needed. The instructions can be pre-loaded to the controller 150, or communicated to the controller via the communications module 604.

As discussed above, the piezos 142 are excited to their natural frequency $f_p = (\Delta t_{piezo})^{-1}$ (about 1 MHz in the disclosed embodiment). To control the operation of the peizos 142, the controller 150 imposes a tunable "on/off" modulation signal over the natural resonant signal at which the piezos 142 are excited. The modulation signal produced by the controller 150 is a square wave having a period $\Delta t_{on} + \Delta t_{off}$ and a modulation frequency $f_M = (\Delta t_{on} + \Delta t_{off})^{-1}$. The on and off time periods $\Delta t_{on}$ and $\Delta t_{off}$ are adjusted by the controller 150 to tune the modulation frequency $f_M$ and the energy associated with the modulation signal. The adjustments to $\Delta t_{on}$ and $\Delta t_{off}$ by the controller 150 determine the resultant acoustic waves $A_{wire}$, $A_{cu}$, and $A_{fluid}$ generated by the piezos 142 and introduced into the microchannels 104. As discussed above, the acoustic waves $A_{wire}$, $A_{cu}$, and $A_{fluid}$ induce resonance with the "in-plane" natural frequencies of the micro-structured boiling surface 126, frequencies associated with aggregate microbubble ebullition cycles on the boiling surface 126, and suitable hydrodynamic acoustic force frequencies that act on the microbubbles when formed within the cooling fluid 106.

The adjustments to $\Delta t_{on}$ and $\Delta t_{off}$ by the controller 150 are made in response to various input signals received from the sensors monitoring operation of the cooling unit 100 and the associated cooling loop 200. For example, the inputs may include temperature and pressure information from the temperature sensors 608 and the pressure sensors 610 as discussed above, inlet and outlet mass flow rates, calculated average heat-flux impositions from the heat source 102, inlet and outlet qualities of the cooling fluid 106, etc., and any combinations thereof. Based on the feedback from the input signals, the controller 150 can execute instructions to perform the adjustments to $\Delta t_{on}$ and $\Delta t_{off}$ according to control methods generally known in the art (e.g., PID loop control techniques, machine learning processes, etc.), in order to achieve the desired enhanced flow boiling cooling results described above (as indicated by, e.g., the characteristic pressure rise inside the microchannels 104 discussed above).

Figure 17:
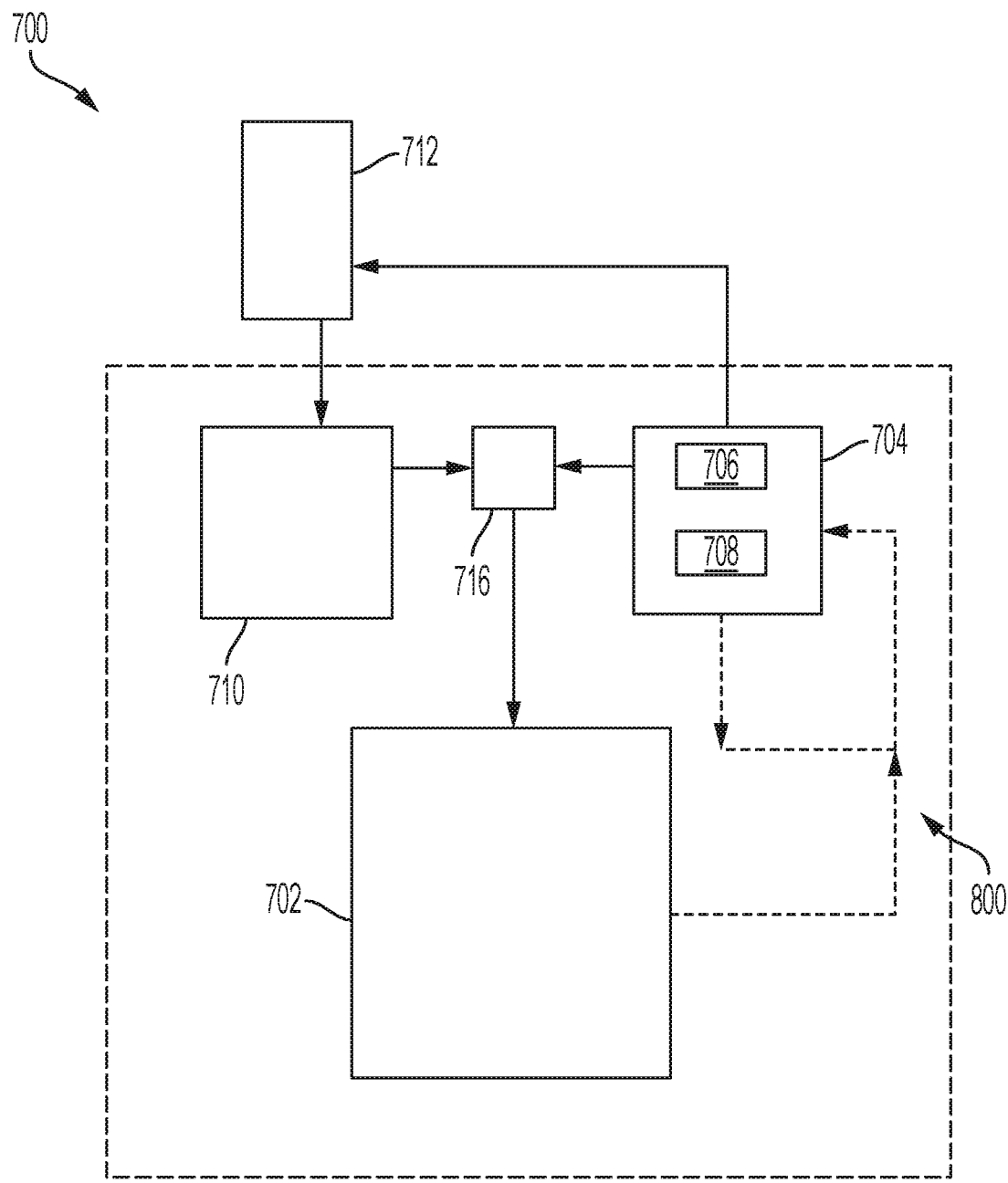
FIG. 17 is a schematic illustration of a data center energy system for providing power and thermal management to a data center.

FIG. 17 illustrates one configuration of a data center energy system 700 for providing power and thermal management to the data center 702. The data center 702 implements the flow boiling server rack cooling systems described above. In the illustrated embodiment, the data center energy system 700 includes an on-site mini-combine cycle power plant (mini-CCPP) 704 provided locally at a site location of the data center 702 for generating electrical power supplied to the data center 702. The mini-CCPP 704 includes micro gas turbines (MGTs) 706 to generate a primary supply of electrical power from a fuel source, and one or more organic Rankine Cycle turbines (ORCs) 708 to generate a secondary supply of electrical power from recovered thermal energy. The data center energy system 700 also includes a site substation 710 that receives electrical power from an energy grid 712, and transformers 714 for transferring the electrical power from the site substation 710 and from the mini-CCPP 704 to the data center 702. As shown in FIG. 17, during periods of low power usage, the mini-CCPP 704 can also supply electrical power to the energy grid 712. The data center energy system 700 also includes a heat recovery system 800 that recaptures thermal energy generated by the server racks 402, and by the MGTs 706. The heat recovery system 800 delivers the recovered thermal energy to the ORCs 708 to produce the secondary supply of electrical power (e.g., for recycled use in powering the data center 702, or for returning to the energy grid 712).

Figure 18A:
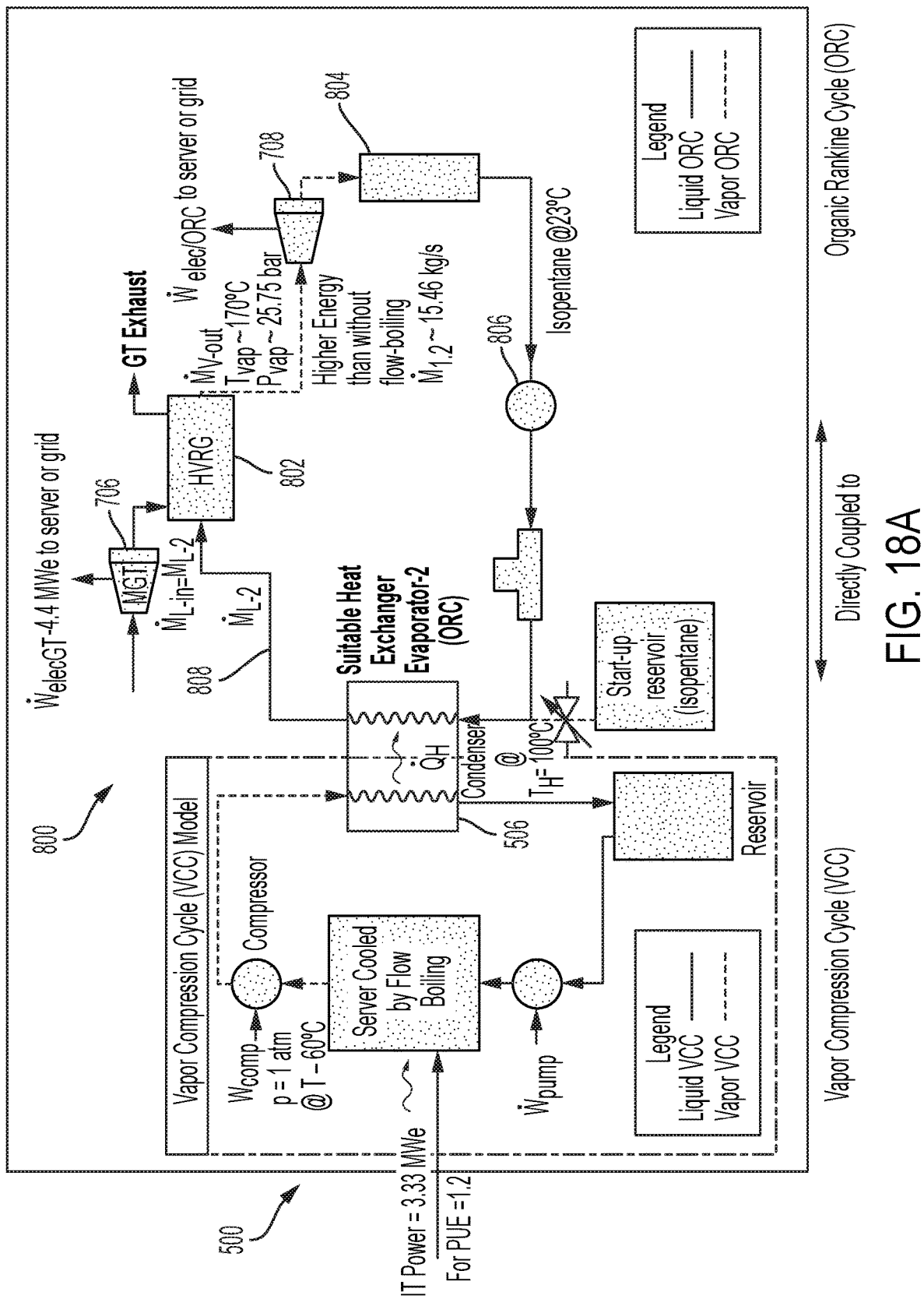
FIG. 18A is a schematic illustration of a heat recovery system of the data center energy system of FIG. 17.

FIG. 18A illustrates the heat recovery system 800 in further detail. For purposes of illustration, the heat recovery system 800 is shown coupled to a single server rack cooling loop 500 in FIG. 18A, but the system 716 can be scaled to serve multiple server rack cooling loops 500 by means generally known in the art. The heat recovery system 800 includes a heat recovery vapor generator (HRVG) 802, a condenser 804, and a pump 806 in fluid communication with the ORC 708 and the heat exchanger 506 of the server rack cooling loop 500. The heat recovery system 800 circulates an organic fluid (e.g., isopentane) within a closed heat recovery loop 808 that includes the HRVG 802, the condenser 804, the pump 806, and the heat exchanger 506. The HRVG 802 is further coupled to the MGTs 706 to receive exhaust gases therefrom. The HRVG 802 raises the heat recovery level by raising the "work potential" of the lower grade heat available from the data center 702.

In operation, the heat recovery system 800 circulates the organic fluid through the closed heat recovery loop 808 by operation of the pump 806. The organic fluid, in liquid phase, passes through the heat exchanger 506 and receives heat from the cooling fluid 106 circulating through the server rack cooling loop 500. The organic fluid exits the heat exchanger 506 and passes through the HRVG 802, where the organic fluid is further heated by the exhaust gases coming from the MGTs 706 and transitions to vapor phase. The vapor phase organic fluid then continues to the ORC 708, which harvests energy from the organic fluid to generate the secondary electrical power supply. From the ORC 708, the organic fluid passes to the condenser 804 and transitions back to liquid phase.

Figure 18B:
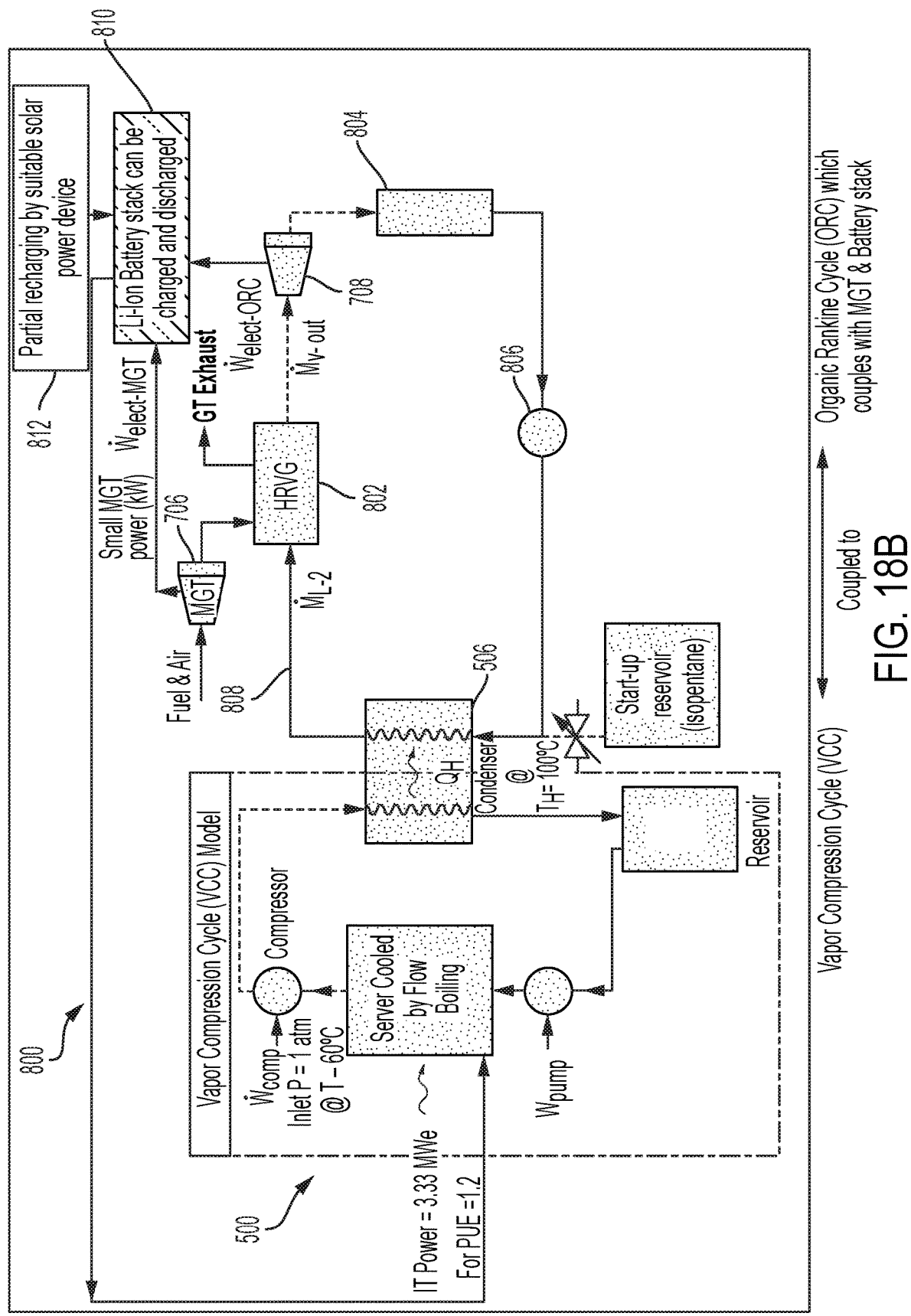
FIG. 18B is a schematic illustration of another embodiment of the heat recovery system of FIG. 18A.

FIG. 18B illustrates another embodiment of the heat recovery system 800. In the embodiment of FIG. 18B, the heat recovery system 800 further includes a battery stack 810 that stores electrical energy generated by the MGTs 706 and by the ORC 708. The battery stack 810 selectively supplies electrical power to the data center 702. In the embodiment of FIG. 18B, the MGTs 706 are no longer the primary power supply—and the power supply is a mix of the battery stack 810, the (relatively smaller in kWs) MGTs 706, the ORC 708, and a solar device 812 for partially charging the battery stack 810. The heat recovery system of FIG. 18B is also able to significantly reduce grid power consumption (thereby cutting operational costs), cut fossil fuel uses, and increase uses of renewables. In fact, depending on local needs and fuel availabilities, the small MGTs 706 in FIG. 18B can be eliminated in some embodiments by replacing the HRVG 802 by a burner-fired HRVG version that can be procured through suitable vendors. The numerical values identified within FIGS. 18A-18B are exemplary in nature and other values for other heat recovery systems 800 may be observed or designed for in other systems 800.

The above disclosure uniquely enables chip to server to rack to data center level cooling and waste heat recovery as per discussions for illustrations in FIGS. 1A-20. This leads to performance and economic superiority over the latest liquid cooling technologies (mostly using single-phase water) in the market.

Immersion cooling techniques (pool boiling based) utilized in the market are not discussed, but a person having ordinary skill in the art can readily apply and adapt microstructures and piezos enhanced flow-boiling approaches described herein to pool boiling systems and system components to significantly improve immersion cooling technologies as well.

In flow through the channels in flow-boiling, besides the boiling-surface process innovations discussed here, the flow is needed for two reasons: (i) liquid supply rate is needed to be greater than vapor generation rate, and (ii) both the vapor generated and surplus liquid need to be forced out of the exit of the channels. Pool boiling simply retains the boiling-surface process innovations discussed here and (i) the stagnant liquid pool automatically tunes liquid supply (by gravity) rate to be equal to the vapor generation rate at the boiling-surface, as well as (ii) it automatically removes the vapor from the boiling-surface by upward buoyancy induced motions (with the vapor eventually being moved out of the reservoir's free-surface on to a condenser and then fed back into the reservoir). Therefore microstructures and piezos enhanced pool-boiling approach for immersion cooling is also contemplated herein.

The foregoing detailed description of the certain exemplary embodiments has been provided for the purpose of explaining the general principles and practical application, thereby enabling others skilled in the art to understand the disclosure for various embodiments and with various modifications as are suited to the particular use contemplated. This description is not necessarily intended to be exhaustive or to limit the disclosure to the exemplary embodiments disclosed. Any of the embodiments and/or elements disclosed herein may be combined with one another to form various additional embodiments not specifically disclosed. Accordingly, additional embodiments are possible and are intended to be encompassed within this specification and the scope of the appended claims. The specification describes specific examples to accomplish a more general goal that may be accomplished in another way.

As used in this application, the terms "front," "rear," "upper," "lower," "upwardly," "downwardly," and other orientational descriptors are intended to facilitate the description of the exemplary embodiments of the present disclosure, and are not intended to limit the structure of the exemplary embodiments of the present disclosure to any particular position or orientation. Terms of degree, such as "substantially" or "approximately" or "about" are understood by those of ordinary skill to refer to reasonable ranges outside of the given value, for example, general tolerances or resolutions associated with manufacturing, assembly, and use of the described embodiments and components.

Although the disclosure has been described in detail with reference to certain preferred embodiments, variations and modifications exist within the scope and spirit of one or more independent aspects of the disclosure as described.

Clause 1: a cooling module for an electronic device, the cooling module comprising: a body having formed therein a plurality of channels, each channel of the plurality of channels defined by a first channel surface and opposing lateral channel surfaces cooperatively defining a rectangular cross section normal to a channel axis; a micro-structured boiling surface positioned adjacent the first channel surface of each channel; a piezoelectric transducer in acoustic communication with one of the opposing lateral channel surfaces of each channel and configured to direct acoustic waves on the micro-structured boiling surface; an inlet header in fluid communication with each channel of the plurality of channels; and an outlet header in fluid communication with each channel of the plurality of channels.

Clause 2: the cooling module of clause 1, wherein the distance between opposing lateral channel surfaces of each channel is greater than 6 mm.

Clause 3: the cooling module of clause 1, wherein the micro-structured boiling surface is a micro-structured mesh.

Clause 4: the cooling module of clause 3, wherein the micro-structured mesh is formed from copper.

Clause 5: the cooling module of clause 1, wherein the piezoelectric transducer is a first piezoelectric transducer and including a second piezoelectric transducer in acoustic communication with the other opposing lateral channel surface.

Clause 6: the cooling module of clause 5, wherein the first and second piezoelectric transducers are transverse mode piezoelectric transducers having a resonant frequency $f_p$ of about 1 megahertz (MHz).

Clause 7: The cooling module of clause 5, wherein the first and second piezoelectric transducers are transverse mode piezoelectric transducers having a resonant frequency ($f_p$), and further including a controller configured to provide a range of acoustic modulating frequencies ($f_M$) resulting from signals of modulating strengths available at $f_p$ and $f_p \pm n \cdot f_M$ where "n≥1" is an integer.

Clause 8: the cooling module of clause 5, wherein the first and second piezoelectric transducers are configured, when a cooling fluid is flowing within the channel, to introduce acoustic waves sufficient to induce resonance of the micro-structured boiling surface.

Clause 9: the cooling module of clause 7, wherein the outlet header includes a primary outlet port and a secondary outlet port, the secondary outlet port configured to receive a liquid-vapor mixture of the cooling fluid.

Clause 10: the cooling module of clause 1, wherein the cooling module is mountable on a microchip for thermal communication therewith.

Clause 11: the cooling module of clause 1, wherein each channel has a length along the channel axis no greater than 6 cm.

Clause 12: a method of cooling an electronic device, the method comprising: passing a heat transfer fluid through one or more channels formed in a cooling module body, each channel defined by a first channel surface and lateral channel surfaces and further including a micro-structured boiling surface adjacent the first channel surface; and energizing a piezoelectric transducer in acoustic communication with one of the lateral channel surfaces of each channel to direct in plane acoustic waves on the micro-structured boiling surface and its vicinity to facilitate formation of microbubbles within the heat transfer fluid at microbubble nucleation sites on the micro-structured boiling surface.

Clause 13: the method of clause 12, wherein passing the heat transfer fluid through one or more channels means passing a subcooled heat transfer fluid through one or more channels.

Clause 14: the method of clause 13, wherein the subcooled heat transfer fluid is within 3° C. of its saturation temperature.

Clause 15: the method of clause 12, wherein energizing a piezoelectric transducer coupled to one of the lateral channel surfaces of each channel to direct in plane acoustic waves on the micro-structured boiling surface means energizing the piezoelectric transducer to its natural 1 MHz frequency ($f_p$) and thereafter imposing and tuning modulating frequencies ($f_M$) associated with an on-off mechanism of the controller resulting in acoustic energy in a modulating frequency range of 1-2000 Hz.

Clause 16: the method of clause 12, wherein energizing a piezoelectric transducer coupled to one of the lateral channel surfaces of each channel to direct acoustic waves toward the micro-structured boiling surface means energizing the piezoelectric transducer to a frequency of between 1 and 2000 Hz.

Clause 17: A controller for a server rack cooling loop for cooling a plurality of electronic devices, the controller comprising: a processor configured to receive inputs of a cooling loop temperature and pressure, determine desired flow boiling parameters of the cooling loop, and transmit signals to a piezoelectric transducer in acoustic communication with a flow channel of the cooling loop that is in thermal communication with an electronic device, the signals configured to operate the piezoelectric transducer to resonate a micro-structured boiling surface positioned within the flow channel.

Various features of the disclosure are set forth in the following claims.

What is claimed is:

1. A cooling module for an electronic device, the cooling module comprising:
    a body having formed therein a plurality of channels, each channel of the plurality of channels defined by a first channel surface positioned between opposing lateral channel surfaces to define a rectangular cross section normal to a channel axis;
    a micro-structured boiling surface positioned adjacent the first channel surface of each channel;
    a first piezoelectric transducer in acoustic communication with one of the opposing lateral channel surfaces of each channel and a second piezoelectric transducer in acoustic communication with the other opposing lateral channel surface, each transducer configured to direct acoustic waves on the micro-structured boiling surface;
    an inlet header in fluid communication with each channel of the plurality of channels; and
    an outlet header in fluid communication with each channel of the plurality of channels,
    wherein the first and second piezoelectric transducers are transverse mode piezoelectric transducers having a resonant frequency ($f_p$), and further including a controller configured to provide a range of acoustic modulating frequencies ($f_M$) to the transducers resulting from signals of modulating strengths available at $f_p$ and $f_p \pm n \cdot f_M$ where "n≥1" is an integer.

2. The cooling module of claim 1, wherein a distance between the opposing lateral channel surfaces of each channel is greater than 6 mm.

3. The cooling module of claim 1, wherein the micro-structured boiling surface is a micro-structured mesh.

4. The cooling module of claim 3, wherein the micro-structured mesh is formed from copper.

5. The cooling module of claim 1, wherein the first and second piezoelectric transducers are configured, when a cooling fluid is flowing within the channel, to introduce acoustic waves sufficient to induce resonance of the micro-structured boiling surface.

6. The cooling module of claim 1, wherein the outlet header includes a primary outlet port and a secondary outlet port, the secondary outlet port configured to receive a liquid-vapor mixture of the cooling fluid.

7. The cooling module of claim 1, wherein the cooling module is mountable on a microchip for thermal communication therewith.

8. The cooling module of claim 1, wherein each channel has a length along the channel axis no greater than 6 cm.

9. A method of cooling an electronic device, the method comprising:
    passing a heat transfer fluid through one or more channels formed in a cooling module body, each channel defined by a first channel surface and lateral channel surfaces and further including a micro-structured boiling surface adjacent the first channel surface; and
    energizing a piezoelectric transducer in acoustic communication with one of the lateral channel surfaces of each channel to direct in plane acoustic waves on the micro-structured boiling surface and its vicinity to facilitate formation of microbubbles within the heat transfer fluid at microbubble nucleation sites on the micro-structured boiling surface,
    wherein energizing the piezoelectric transducer in acoustic communication with one of the lateral channel surfaces of each channel to direct in plane acoustic waves on the micro-structured boiling surface means energizing the piezoelectric transducer to its natural 1 MHz frequency ($f_p$) and thereafter imposing and tuning modulating frequencies ($f_M$) associated with an on-off mechanism of the controller resulting in acoustic energy in a modulating frequency range of 1-2000 Hz.

10. The method of claim 9, wherein passing the heat transfer fluid through one or more channels means passing a subcooled heat transfer fluid through the one or more channels.

11. The method of claim 10, wherein the subcooled heat transfer fluid is within 3° C. of its saturation temperature.

\* \* \* \* \*